(12) United States Patent
Kanna

(10) Patent No.: US 8,618,217 B2
(45) Date of Patent: Dec. 31, 2013

(54) TOPCOAT COMPOSITION, ALKALI DEVELOPER-SOLUBLE TOPCOAT FILM USING THE COMPOSITION AND PATTERN FORMING METHOD USING THE SAME

(75) Inventor: Shinichi Kanna, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 880 days.

(21) Appl. No.: 12/271,510

(22) Filed: Nov. 14, 2008

(65) Prior Publication Data

US 2009/0136878 A1 May 28, 2009

Related U.S. Application Data

(60) Provisional application No. 61/016,653, filed on Dec. 26, 2007.

(30) Foreign Application Priority Data

Nov. 14, 2007 (JP) .................. 2007-295328

(51) Int. Cl.
| | | |
|---|---|---|
| C08L 25/14 | (2006.01) | |
| C08L 27/12 | (2006.01) | |
| C08L 33/10 | (2006.01) | |
| C08L 33/16 | (2006.01) | |
| C08L 33/20 | (2006.01) | |
| C08L 33/26 | (2006.01) | |
| C08L 35/06 | (2006.01) | |
| C08L 43/04 | (2006.01) | |
| C08L 83/06 | (2006.01) | |
| G03F 7/004 | (2006.01) | |
| G03F 7/09 | (2006.01) | |

(52) U.S. Cl.
CPC ............. *C08L 25/14* (2013.01); *C08L 27/12* (2013.01); *C08L 33/10* (2013.01); *C08L 33/16* (2013.01); *C08L 33/20* (2013.01); *C08L 33/26* (2013.01); *C08L 35/06* (2013.01); *C08L 43/04* (2013.01); *C08L 83/06* (2013.01); *G03F 7/092* (2013.01)
USPC ........... 525/103; 525/451; 525/474; 525/479; 525/534; 525/535; 525/540; 430/272.1; 430/273.1

(58) Field of Classification Search
CPC ......... C08L 25/14; C08L 27/12; C08L 33/10; C08L 33/16; C08L 33/20; C08L 33/26; C08L 35/06; C08L 43/04; C08L 83/06
USPC ............ 430/270.1, 271.1, 326, 272.1, 273.1; 526/242, 245; 525/103, 451, 474, 479, 525/534, 535, 540
See application file for complete search history.

(56) References Cited

U.S. PATENT DOCUMENTS

| | | | |
|---|---|---|---|
| 4,098,756 A * | 7/1978 | Miller et al. | 525/120 |
| 4,170,686 A * | 10/1979 | Miller et al. | 428/416 |
| 4,480,910 A | 11/1984 | Takanashi et al. | |
| 4,822,716 A * | 4/1989 | Onishi et al. | 430/192 |
| 6,984,476 B2 * | 1/2006 | Kobayashi et al. | 430/7 |
| 8,012,666 B2 * | 9/2011 | Gallagher et al. | 430/270.1 |
| 2003/0193624 A1* | 10/2003 | Kobayashi et al. | 349/42 |
| 2005/0202351 A1* | 9/2005 | Houlihan et al. | 430/322 |
| 2007/0148589 A1* | 6/2007 | Kanda et al. | 430/270.1 |
| 2007/0160930 A1* | 7/2007 | Wang et al. | 430/270.1 |
| 2007/0224539 A1* | 9/2007 | Mizutani et al. | 430/270.1 |

FOREIGN PATENT DOCUMENTS

| | | |
|---|---|---|
| EP | 1754999 A2 | 2/2007 |
| EP | 1 837 704 A2 | 9/2007 |
| JP | 57-153433 A | 9/1982 |
| JP | 7-220990 A | 8/1995 |
| JP | 10-303114 A | 11/1998 |
| JP | 2003-335984 A | 11/2003 |

OTHER PUBLICATIONS

European Office Action in counterpart European Application No. 08019926.8-2109, dated Mar. 25, 2010.
B.J Lin, Semiconductor Foundry, Lithography, and Partners; Emerging Lithographic Technologies VI, Roxann L. Engelstaed, ed. vol. 4688(2002) p. 11-24.
J. A. Hoffnagle et al,"Liquid immersion deep ultraviolet interferometric lithography", J. Vac. Sci. Technol. B 17(6)1999 pp. 3306-3309.
Nikkei Micro-Devices, Apr. 1, 2004 pp. 77-87.
Partial European Search Report for EP 08019926 dated Feb. 25, 2009.
Extended European Search Report dated Aug. 4, 2009.
Office Action issued Aug. 15, 2013 by the Taiwanese Patent Office in corresponding Taiwanese Application No. 097143984.

* cited by examiner

*Primary Examiner* — John Chu

(74) *Attorney, Agent, or Firm* — Sughrue Mion, PLLC

(57) ABSTRACT

A topcoat composition to be applied on a resist film is provided, the topcoat composition including: (A) an alkali-soluble resin; (B) a compound containing at least one of an Si atom and an F atom, and increasing a contact angle on a surface of the topcoat film; and (C) a solvent.

30 Claims, 2 Drawing Sheets

TOPCOAT COMPOSITION, ALKALI DEVELOPER-SOLUBLE TOPCOAT FILM USING THE COMPOSITION AND PATTERN FORMING METHOD USING THE SAME

BACKGROUND OF THE INVENTION

1. Field of the Invention

The present invention relates to a topcoat composition for use in the process of producing a semiconductor such as IC, in the production of a circuit board for liquid crystal, thermal head and the like, and in the lithography process of other photofabrication; an alkali developer-soluble topcoat film using the composition; and a pattern forming method using the topcoat film. More specifically, the present invention relates to a topcoat composition suitable for exposure by an immersion-type projection exposure apparatus using a light source that emits far ultraviolet light at a wavelength of 300 nm or less; an alkali developer-soluble topcoat film using the composition; and a pattern forming method using the topcoat film.

2. Description of the Related Art

Along with the finer fabrication of a semiconductor device, there is becoming shorter the wavelength of the exposure light source and higher the numerical aperture (high NA) of the projection lens, and an exposure machine with NA of 0.84 using an ArF excimer laser having a wavelength of 193 nm as a light source has been so far developed. As commonly well known, these features can be expressed by the following formulae:

(Resolving power)=$k_1 \cdot (\lambda/NA)$ (Depth of focus)=$\pm k_2 \cdot \lambda/NA^2$ wherein $\lambda$ is the wavelength of the exposure light source, NA is the numerical aperture of the projection lens, and $k_1$ and $k_2$ are coefficients related to the process.

In order to realize still shorter wavelength and higher resolving power, studies are being made on an exposure machine where an $F_2$ excimer laser having a wavelength of 157 nm is used as the light source. However, the lens material used for the exposure apparatus so as to realize shorter wavelength and the material used for the resist are very limited and therefore, it is extremely difficult to stabilize the production cost or quality of the apparatus and materials. This may lead to a failure in outfitting the exposure apparatus and the resist each assured of sufficiently high performance and stability within a required time period.

Conventionally, a so-called immersion method of filling a high refractive-index liquid (hereinafter sometimes referred to as an "immersion liquid") between the projection lens and the sample has been known as a technique of increasing the resolving power in an optical microscope.

As for the "effect of immersion", assuming that $\lambda_0$ denotes the wavelength of exposure light in air, n denotes the refractive index of the immersion liquid to air and $\theta$ denotes the convergence half-angle of beam and that $NA_0 = \sin \theta$, the above-described resolving power and depth of focus when immersed can be expressed by the following formulae:

(Resolving power)=$k_1 \cdot (\lambda_0/n)/NA_0$ (Depth of focus)=$\pm k_2 \cdot (\lambda_0/n)/NA_0^2$ That is, the effect of immersion is equal to use of an exposure wavelength of 1/n. In other words, in the case of a projection optical system with the same NA, the depth of focus can be made n times larger by the immersion. This is effective for all pattern profiles and can be combined with super-resolution techniques which are being studied at present, such as phase-shift method and modified illumination method.

Examples of the apparatus where this effect is applied to the transfer of a fine image pattern of a semiconductor device are described in JP-A-57-153433 and JP-A-7-220990 (the term "JP-A" as used herein means an "unexamined published Japanese patent application").

JP-A-10-303114 indicates that the control of refractive index of the immersion liquid is important because a change in the refractive index of the immersion liquid brings about deterioration of the projected image due to wave front aberration of the exposure machine, and discloses an immersion liquid with a refractive index of which the temperature coefficient is controlled to a certain range, or, as a suitable immersion liquid, water where the surface tension is decreased or an additive of increasing the surface activity is added. However, the additive is not disclosed or the resist suitable for immersion exposure techniques is not discussed.

Recent progress of the immersion exposure technique is reported, for example, in SPIE Proc., 4688, 11 (2002) and J. Vac. Sci. Tecnol. B, 17 (1999). In the case of using an ArF excimer laser as the light source, in view of safety on handling as well as transmittance and refractive index at 193 nm, pure water (refractive index at 193 nm: 1.44) is considered most promising as the immersion liquid.

In the case of using an $F_2$ excimer laser as the light source, a fluorine-containing solution is being studied in view of balance between transmittance and refractive index at 157 nm, but those satisfied from the aspect of environmental safety or refractive index have been not yet found out. The immersion exposure technique is expected to be most soon mounted on an ArF exposing machine in view of the degree of immersion effect and the maturity of resist.

Since the advent of a resist for a KrF excimer laser (248 nm), an image forming method called chemical amplification is used as the image forming method for a resist so as to compensate the reduction in the sensitivity due to light absorption. To describe this by taking as an example the image forming method using positive chemical amplification, an acid generator in the exposed area decomposes upon exposure to generate an acid, the acid generated is used as a reaction catalyst in the post-exposure baking (PEB) to convert the alkali-insoluble group into an alkali-soluble group, and the exposed area is removed by alkali development.

In the immersion exposure, the resist film is exposed through a photomask in the state of an immersion liquid being filled between the resist film and the optical lens, and the pattern of the photomask is thereby transferred to the resist film. At this times there is a case where an image is not formed due to permeation of the immersion liquid into the inside of the resist film (Nikkei Micro-Device, April, 2004). Also, it is feared that due to elution of an organic substance or the like from the resist film into the immersion liquid, impurities are mixed in the immersion liquid and contaminate the lens or exposure apparatus to hinder the exposure.

In order to avoid such a problem, a method of providing a topcoat film between the resist film and the lens to prevent the resist from coming into direct contact with water is known (see, for example, Nikkei Micro-Device, April, 2004).

It is not clarified yet what a material is suitable for the topcoat, but studies by the present inventors reveal that depending on the material of the topcoat, bad coating uniformity on the resist film or generation of particles after aging or storage may occur. In this respect, improvement is necessary. Also, there is room for improvement on the sensitivity of the underlying resist film.

SUMMARY OF THE INVENTION

An object of the present invention is to provide a topcoat composition capable of forming a topcoat film that can be separated in the developing step in the fine pattern-forming process by immersion exposure and is assured of a large receding contact angle for the immersion liquid (e.g. water) and excellent followability of the immersion liquid, an alkali developer-soluble topcoat film using the composition, and a pattern forming method using the topcoat film.

The present invention includes the following constructions, and the above-described object of the present invention can be attained by these constructions.

(1) A topcoat composition to be applied on a resist film to form a topcoat film, comprising:
 (A) an alkali-soluble resin;
 (B) a compound containing at least one of an Si atom and an F atom, and increasing a contact angle on a surface of the topcoat film; and
 (C) a solvent.

(2) The topcoat composition as described in (1) above, wherein when the topcoat film is formed by adding the compound (B) in an amount of 1 part by mass based on 100 parts by mass of the total solid amount of the topcoat film but not including the solid amount of the compound (B), the compound (B) increases a receding contact angle of the topcoat film by 5.0% or more when compared with a receding contact angle of the topcoat film formed by the same topcoat composition except for not containing the compound (B).

(3) The topcoat composition as described in (1) or (2) above, wherein a content of a polar group(s) in the compound (B) (number of a polar group(s)/molecular weight) is 80% or less of that in the resin (A).

(4) The topcoat composition as described in any of (1) to (3) above, wherein the compound (B) is insoluble in an alkali developer.

(5) The topcoat composition as described in any of (1) to (4) above, wherein the resin (A) has a polar group represented by formula (1):

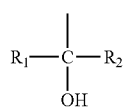

(1)

wherein $R_1$ and $R_2$ is the same or different and each independently represents a hydrogen atom or an alkyl group, and $R_1$ and $R_2$ may combine with each other to form a ring.

(6) The topcoat composition as described in any of (1) to (5) above, wherein the solvent (C) contains an alcohol solvent.

(7) The topcoat composition as described in any of (1) to (4) and (6) above, wherein the resin (A) has a polar group represented by formula (2):

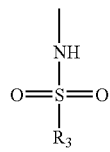

(2)

wherein $R_3$ represents an alkyl group or a cycloalkyl group.

(8) The topcoat composition as described in any of (1) to (7) above, wherein an addition amount of the compound (B) is 10 mass % or less based on an entire amount of solid contents of the topcoat composition.

(9) The topcoat composition as described in any of (1) to (8) above, wherein the compound (B) is a solid at an ordinary temperature.

(10) The topcoat composition as described in any of (1) to (9) above, wherein the topcoat film is soluble in an alkali developer.

(11) An alkali developer-soluble topcoat film, comprising:
 (B) a compound containing at least one of an Si atom and an F atom, and increasing a contact angle on a surface of the topcoat film, the compound (B) covering partially or entirely a surface of the topcoat film,
 wherein the topcoat film has a receding contact angle for water of 70° or more.

(12) The alkali developer-soluble topcoat film as described in (11) above, which has a coverage of the compound (B) on the surface of the topcoat film of 30% or more.

(13) A pattern forming method, comprising:
 applying the topcoat composition described in any of (1) to (10) above on a resist film to form a topcoat film; and
 exposing and developing the resist film.

(14) The pattern forming method as described in (13) above, wherein the resist film is exposed in water as an immersion liquid.

DETAILED DESCRIPTION OF THE INVENTION

Figure 1:
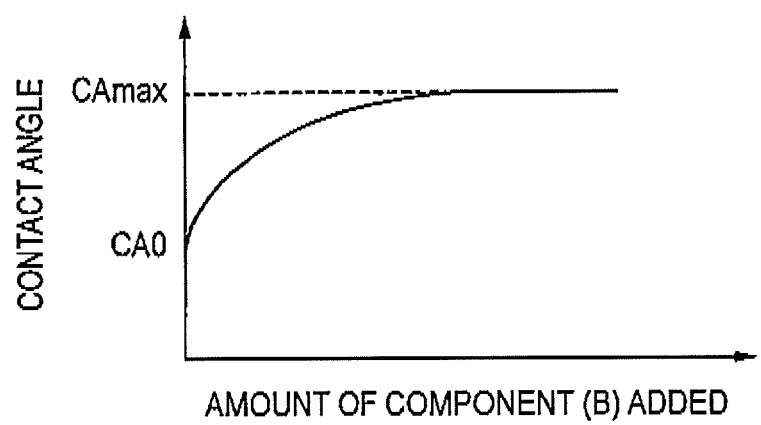
FIG. 1 represents a graph for defining the coverage of the component (B) on the surface of the topcoat film in the present invention.

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(A) Alkali-Soluble Resin

The topcoat composition of the present invention contains an alkali-soluble resin (hereinafter sometimes referred to as a "resin (A)").

The resin (A) is preferably water-insoluble.

The resin (A) is alkali-soluble, so that without specially providing a step of separating the topcoat film, the topcoat can be easily dissolved and removed by alkali development.

Also, a topcoat film containing the water-insoluble resin (A) intervenes between the resist film and the immersion liquid and prevents not only the immersion liquid from permeating into the inside of the resist film but also the resist component from dissolving out into the liquid emulsion, so that in the pattern formation by immersion liquid, an appropriate pattern can be obtained.

The term "water-insoluble" as used herein indicates such a property that when a solution obtained by dissolving the resin in a solvent is coated on a silicon wafer and dried and the formed film is dipped in pure water at 23° C. for 10 minutes and after drying, measured for the thickness, the film thickness is not decreased.

Also, the term "alkali-soluble" means to be soluble in an alkali developer used for development in the pattern formation using a resist and indicates such a property that when a solution obtained by dissolving the resin in a solvent is coated on a silicon wafer and dried and the formed film is processed with a developer by using an aqueous 2.38 mass % tetramethylammonium hydroxide solution at 23° C., the film is dissolved at a dissolution rate of 1 nm/sec or more and the film thickness becomes zero. (In this specification, mass ratio is equal to weight ratio.)

The monomer unit constituting the resin (A) is not particularly limited, but from the standpoint of enhancing the alkali solubility, at least one monomer having an acid group with pKa of less than 14, preferably from 0 to 13, most preferably from 4 to 11 (hereinafter sometimes referred to as an "acidic monomer"), is preferably contained as the monomer constituting the resin (A).

The acid dissociation constant pKa is a value described in Kagaku Binran II (Chemical Handbook II), 4th Edition (revised version), compiled by Nippon Kagaku-kai, Maruzen Co. (1993), and the pKa value of the monomer is a value measured using an infinite dilution solution at 25° C.

The acid group contained in the acidic monomer is not particularly limited, but preferred examples thereof include a carboxylic acid group, an ammonium salt, a phenolic hydroxyl group, a sulfonamide group, an active methylene group and a fluoro-alcohol group.

Out of these acid groups, a monomer containing a fluoro-alcohol group is particularly preferred because water repellency to pure water when using pure water as the immersion liquid and good followability of the immersion liquid when scanning the wafer at a high speed in the immersion exposure are likely to be obtained. The fluoro-alcohol group is a fluoroalkyl group substituted by at least one hydroxyl group and preferably has a carbon number of 1 to 10, more preferably from 1 to 5. Specific examples of the fluoro-alcohol group include —$CF_2OH$, —$CH_2CF_2OH$, —$CH_2CF_2CF_2OH$, —$C(CF_3)_2OH$, —$CF_2CF(CF_3)OH$ and —$CH_2C(CF_3)_2OH$. In particular, the fluoro-alcohol group is preferably a hexafluoroisopropanol group.

The acidic monomer may contain only one acid group or two or more acid groups. The repeating unit derived from this monomer preferably has 2 or more acid groups, more preferably from 2 to 5 acid groups, still more preferably from 2 to 3 acid groups, per one repeating unit.

Specific preferred examples of the repeating unit derived from the acidic monomer contained in the resin (A) are set forth below but the present invention is not limited thereto.

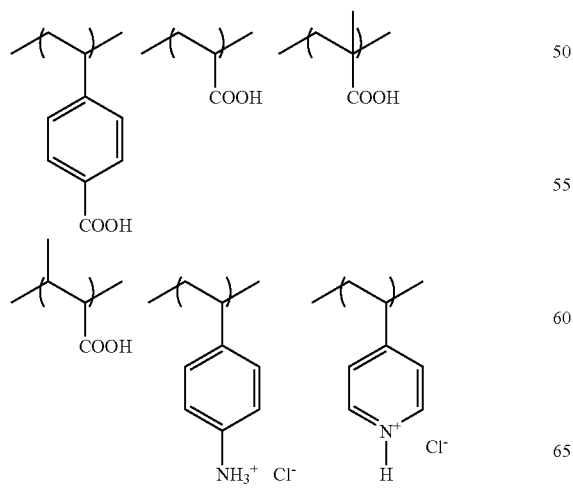

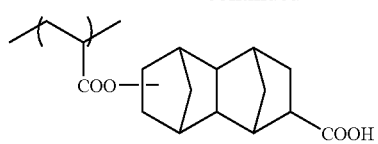

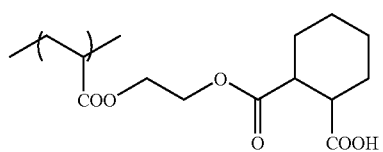

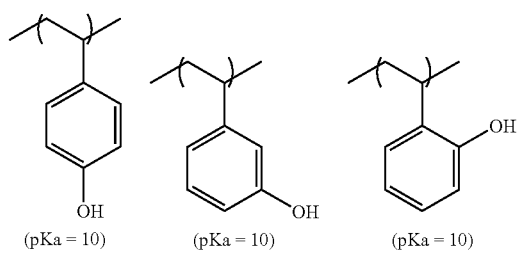

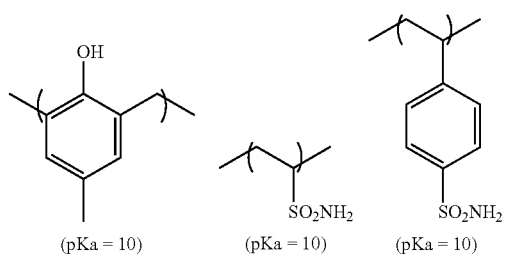

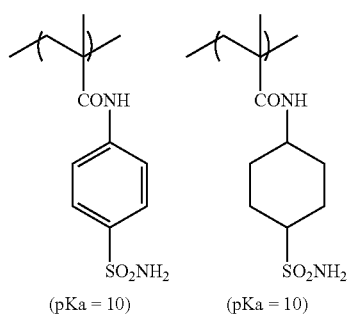

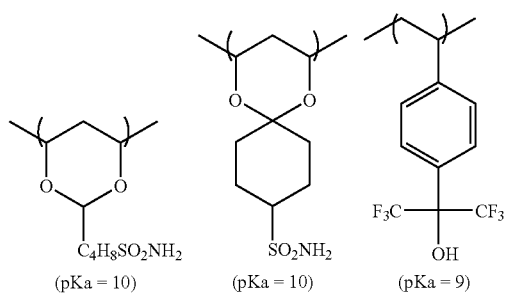

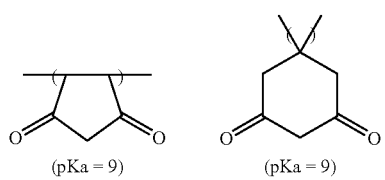

-continued

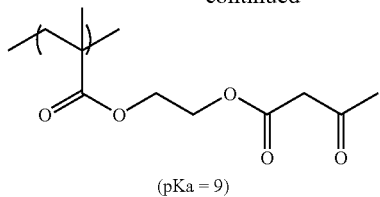
(pKa = 9)

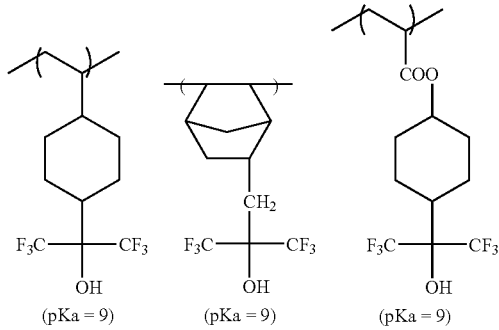
(pKa = 9)  (pKa = 9)  (pKa = 9)

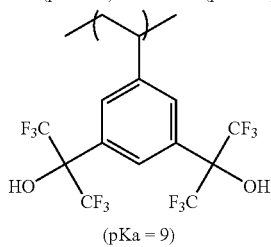
(pKa = 9)

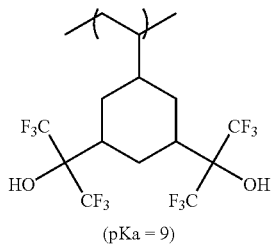
(pKa = 9)

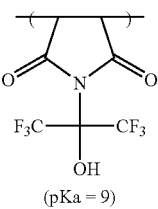
(pKa = 9)

The resin (A) preferably contains a repeating unit having a polar group represented by the following formula (1) or (2):

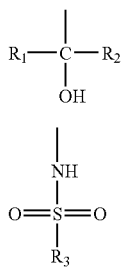

(1)

(2)

In formulae (1) and (2), $R_1$ and $R_2$ may be the same or different and each independently represents a hydrogen atom or an alkyl group, and $R_1$ and $R_2$ may combine with each other to form a ring; and $R_3$ represents an alkyl group or a cycloalkyl group.

In formulae (1) and (2), the alkyl group of $R_1$ to $R_3$ is preferably an alkyl group having a carbon number of 1 to 5. The alkyl group of $R_1$ to $R_3$ is preferably substituted by a fluorine atom.

The cycloalkyl group of $R_3$ is preferably a cycloalkyl group having a carbon number of 3 to 10. The cycloalkyl group of $R_3$ is preferably substituted by a fluorine atom.

$R_1$ to $R_3$ each is more preferably a trifluoromethyl group.

Specific preferred examples of the resin (A) are set forth below, but the present invention is not limited thereto.

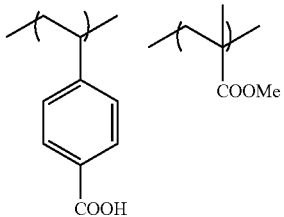
(A-1)

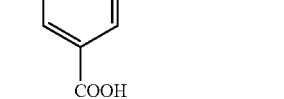

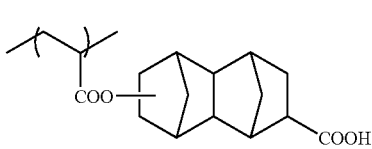
(A-2)

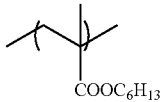
(A-3)

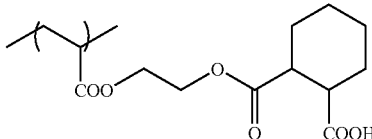

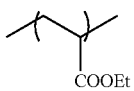
(A-4)

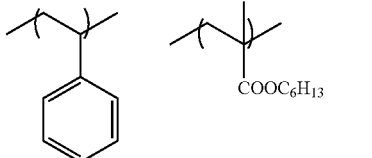

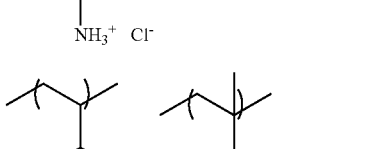
(A-5)

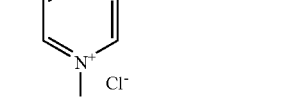
(A-6)

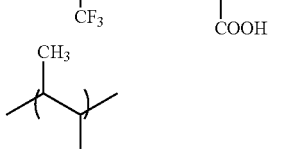

-continued (A-22) 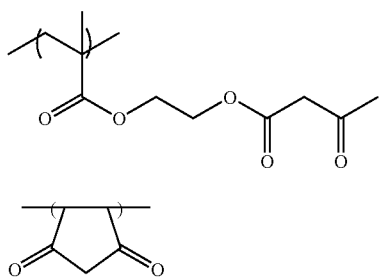
(A-23) 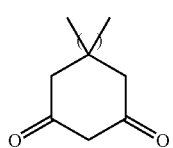
(A-24) 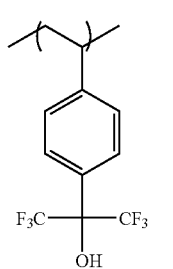
(A-25) 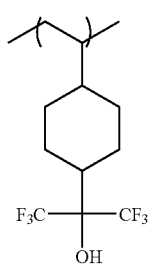
(A-26) 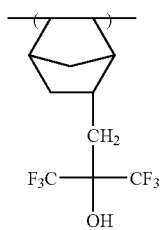
(A-27) 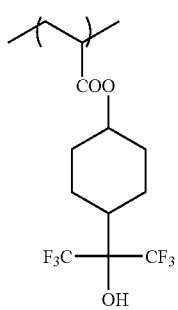
(A-28) 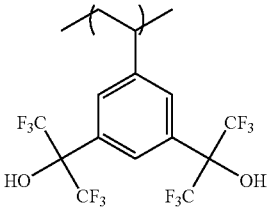
(A-29) 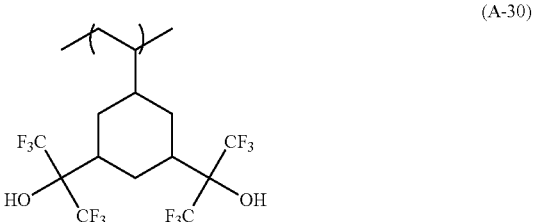
(A-30) 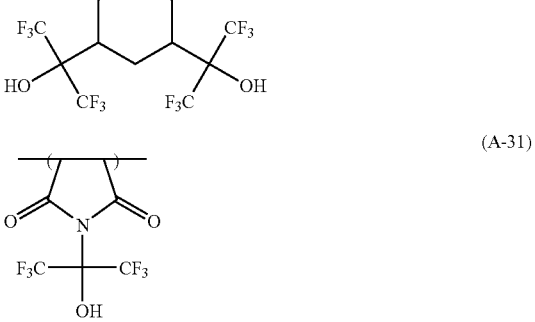
(A-31) 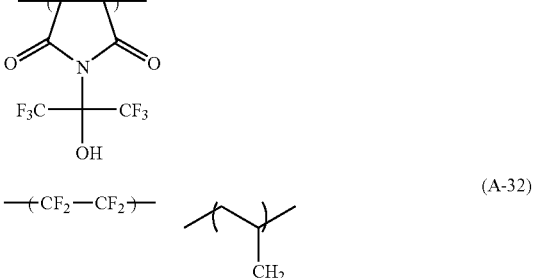
(A-32) 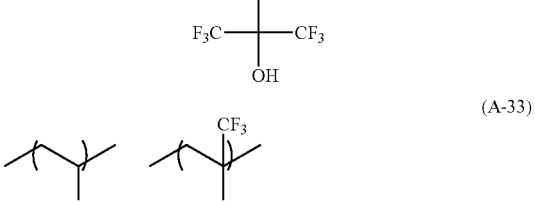
(A-33) 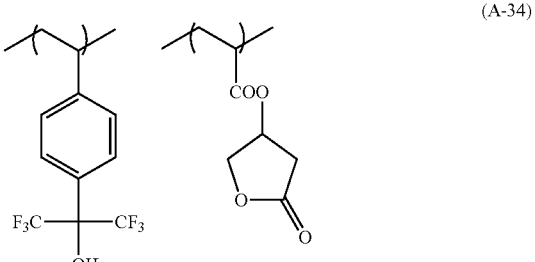
(A-34) 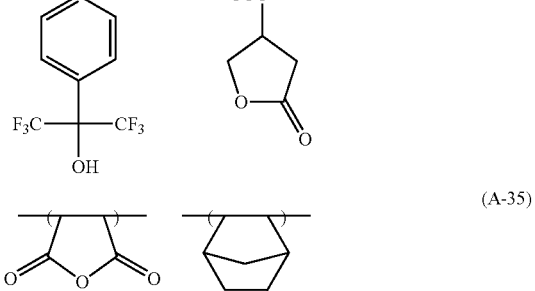
(A-35) 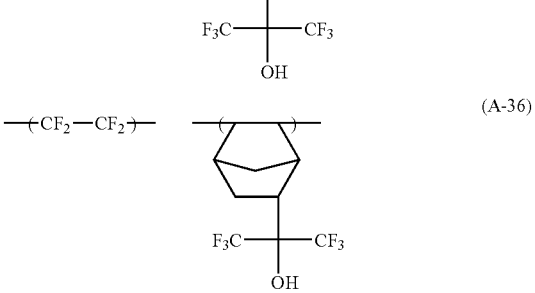
(A-36)

(A-37) 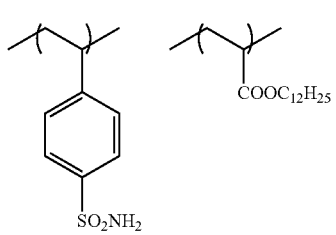
(A-38) 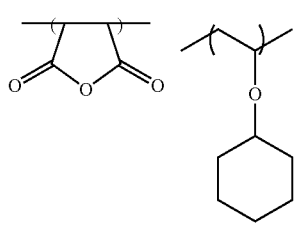
(A-39) 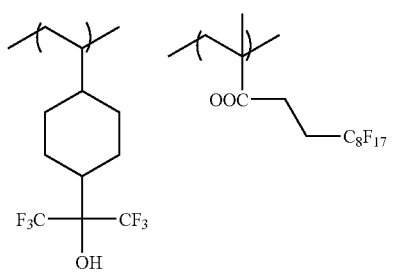
(A-40) 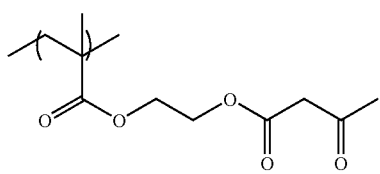
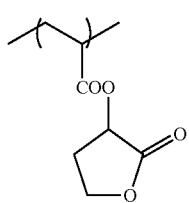
(A-41) 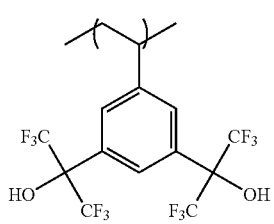
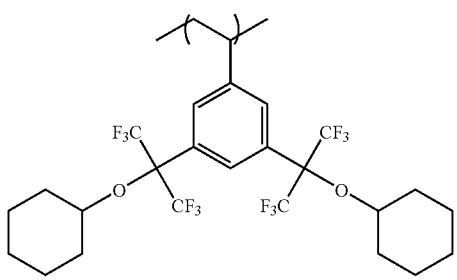
(A-42) 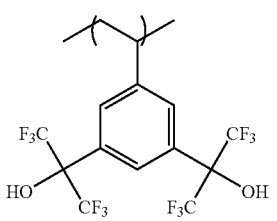
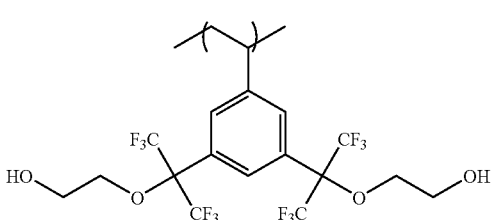
(A-43) 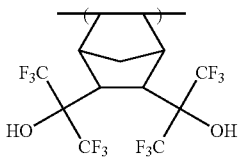
(A-44) 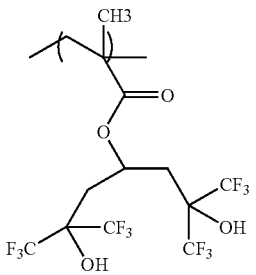
(A-45) 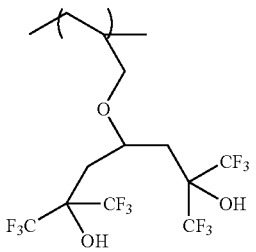
(A-46) 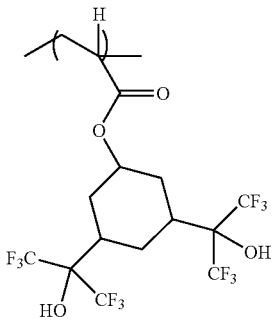

(A-47)
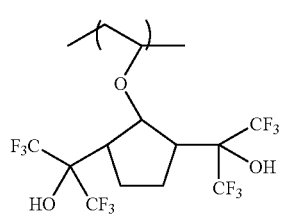
(A-48)
(A-49)
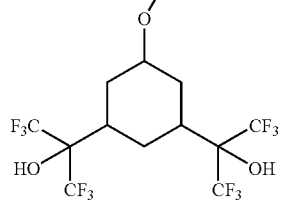
(A-50)
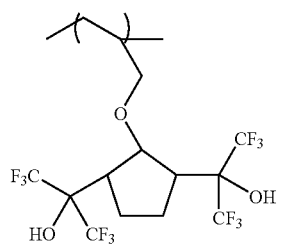
(A-51)
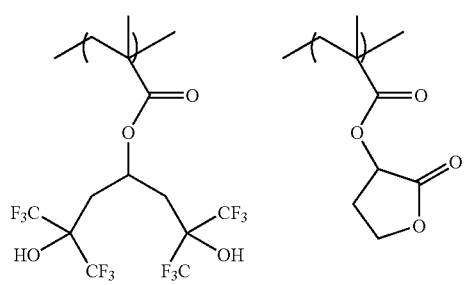
(A-52)
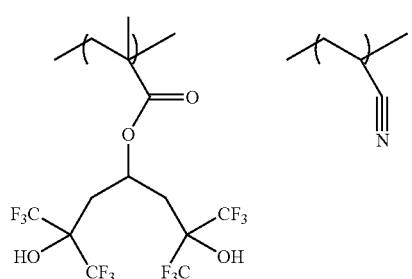
(A-53)
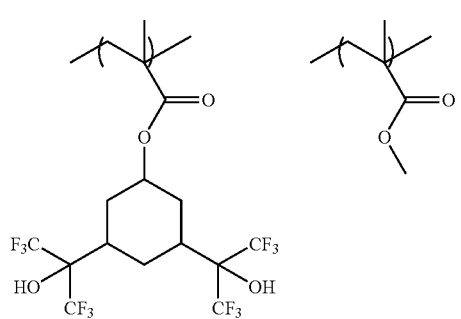
(A-54)
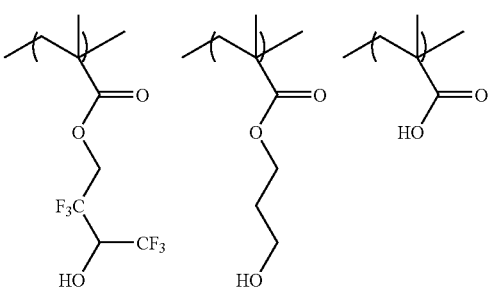
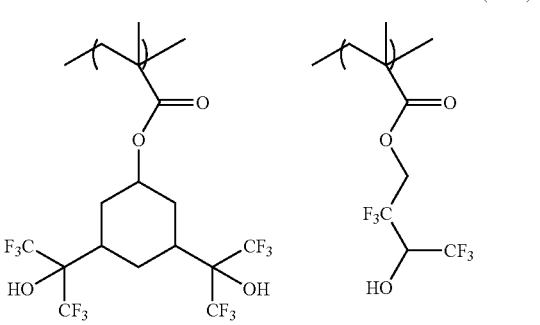
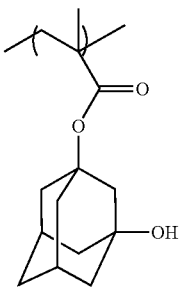
(A-55)
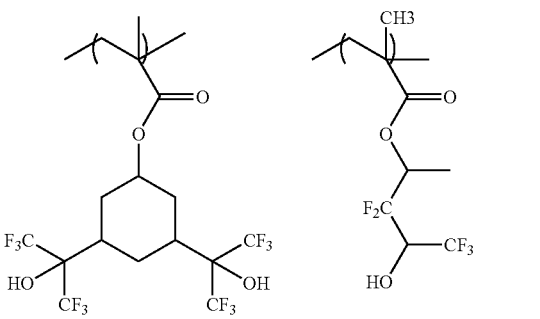
(A-56)
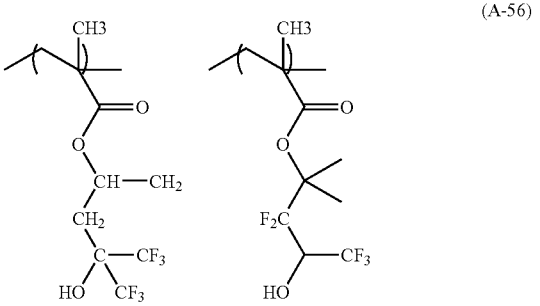

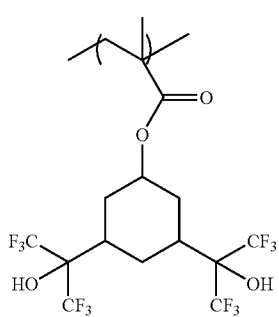 (A-57)
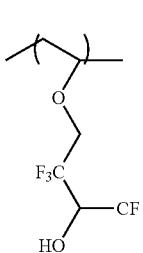
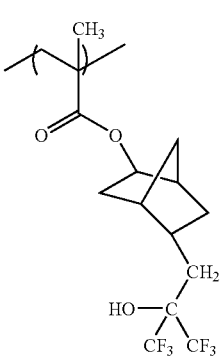 (A-58)
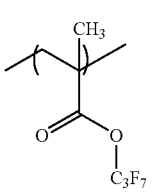
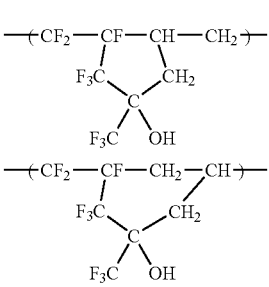 (A-59)
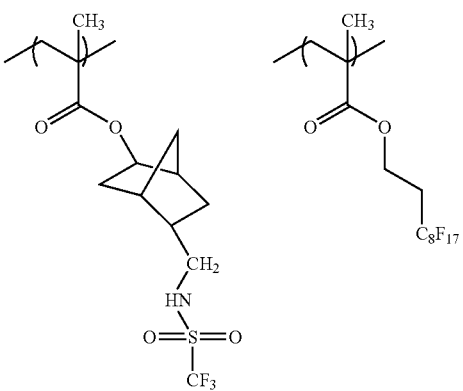 (A-60)
(A-61)
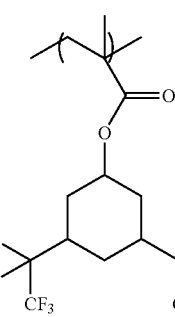 (A-62)
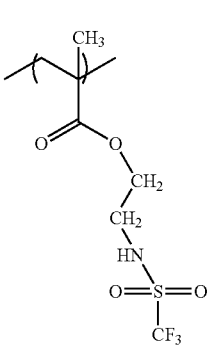 (A-63)
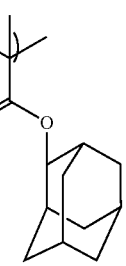

-continued (A-64) 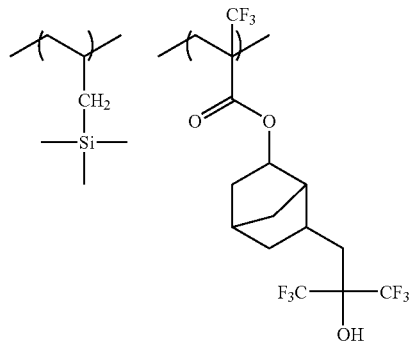

(A-65) 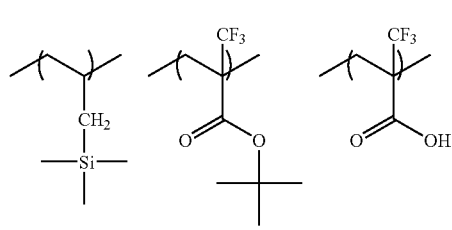

(A-66) 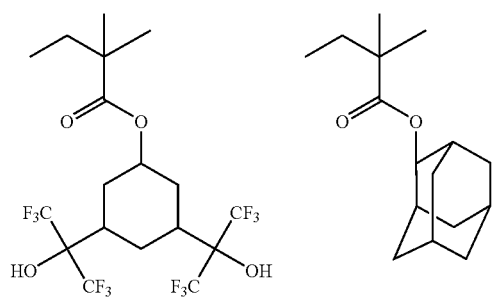

(A-67) 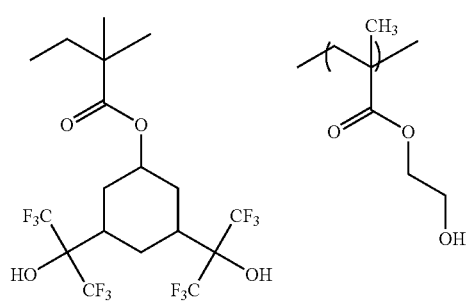

(A-68) 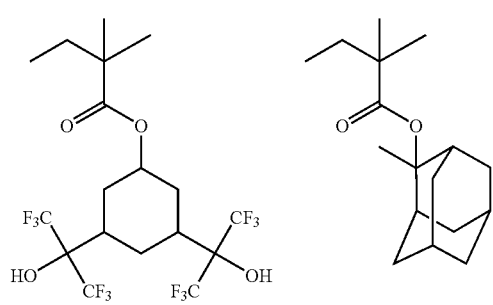

-continued (A-69) 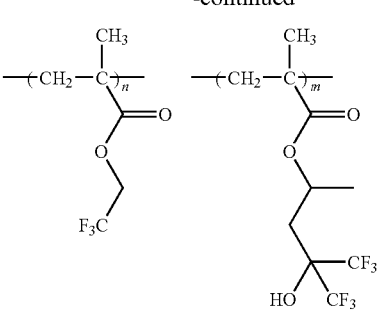

(A-70) 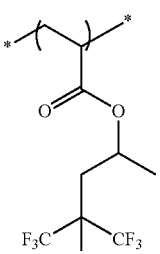

(A-71) 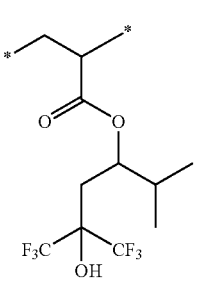

(A-72) 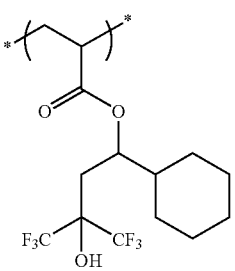

The ratio of the acidic monomer contained in the resin (A) is appropriately set so that both insolubility in water and solubility in an alkali developer can be satisfied.

In the case where the acidic monomer contained in the resin (A) has relatively strong acidity with a pKa of less than 8, the acidic monomer is preferably contained such that the resin (A) has an acid value of 1.0 to 5.0, more preferably from 2.0 to 4.5.

In the case where the acidic monomer contained in the resin (A) has relatively weak acidity with a pKa of 8 or more, the acidic monomer is preferably contained such that the resin (A) has an acid value of 3.0 to 7.0, more preferably from 3.5 to 5.5.

Also, both a monomer having relatively strong acidity with a pKa of less than 8 and a monomer having relatively weak acidity with a pKa of 8 or more may be contained as an acidic monomer unit constituting the resin (A). In this case, the ratio is preferably adjusted such that the resin (A) has an acid value of 2.0 to 5.0, more preferably from 2.5 to 4.5.

In addition to the repeating structural units derived from the above-described acidic monomers, the resin (A) may contain other repeating structural units. Examples of the monomer that forms other repeating structural units include a compound having one addition-polymerizable unsaturated bond, selected from acrylic acid esters, methacrylic acid esters, acrylamides, methacrylamides, allyl compounds, vinyl ethers and vinyl esters. Other than these, an addition-polymerizable unsaturated compound copolymerizable with the monomers corresponding to the above-described various repeating structural units may be copolymerized.

The resin (A) is preferably transparent to light from the exposure light source used, because light reaches the resist film through the topcoat film upon exposure. In use for ArF immersion exposure, the resin (A) preferably has no aromatic group in view of transparency to ArF light.

The resin (A) can be synthesized by an ordinary method (for example, radical polymerization).

For example, in a general synthesis method, monomer species are charged into a reaction vessel en bloc or along the reaction and dissolved, if desired, in a reaction solvent, for example, ethers such as tetrahydrofuran, 1,4-dioxane and diisopropyl ether, ketones such as methyl ethyl ketone and methyl isobutyl ketone, an ester solvent such as ethyl acetate or a solvent capable of dissolving the composition of the present invention, which is described later, such as propylene glycol monomethyl ether acetate, propylene glycol monomethyl ether and cyclohexanone, the obtained solution is homogenized and then heated, if desired, in an inert gas atmosphere such as nitrogen or argon, and polymerization is started using a commercially available radical polymerization initiator (e.g., azo-based initiator or peroxide). The initiator is added in addition or in parts, if desired. After the completion of reaction, the reaction product is charged into a solvent, and the desired polymer is recovered by a method such as powder or solid recovery. The reaction concentration is usually 20 mass % or more, preferably 30 mass % or more, still more preferably 40 mass % or more, and the reaction temperature is usually from 10 to 150° C., preferably from 30 to 120° C., more preferably from 50 to 100° C.

The synthesis of the resin (A) is not limited to radical polymerization, but various synthesis methods may be used. In addition to radical polymerization, the resin may be synthesized, for example, by cationic polymerization, anionic polymerization, addition polymerization, cyclization polymerization, polyaddition, polycondensation or addition condensation.

Furthermore, commercially available various resins may also be used.

As for each of the repeating structural units above, one kind may be used or a plurality of kinds may be used as a mixture. Also, in the present invention, one kind of a resin may be used or a plurality of kinds of resins may be used in combination.

The weight average molecular weight of the resin (A) is, in terms of polystyrene as measured by gel permeation chromatography (GPC) method, preferably 1,000 or more, more preferably from 1,000 to 200,000, and still more preferably from 3,000 to 20,000.

In the resin (A), the content of the residual monomer is preferably 5 mass % or less from the standpoint of preventing, for example, elution of the substance. The content of the residual monomer is more preferably 3 mass % or less. The residual monomer contained in the resin (A) can be quantitatively determined by gel permeation chromatography (GPC), high-performance liquid chromatography (HPLC), gas chromatography (GC) or the like.

The amount of the residual monomer in the resin (A) can be set to fall in the range above by recrystallizing the synthesized resin (A) in a solvent capable of well dissolving the residual monomer or by passing the resin through a silica gel column/an alumina column.

The molecular weight distribution (Mw/Mn, also called dispersity) is usually from 1 to 5, preferably from 1 to 4, more preferably from 1 to 3.

In the topcoat composition of the present invention, the blending amount of the resin (A) is preferably from 60 to 99.9 mass %, more preferably from 70 to 99.5 mass %, based on the entire solid content of the topcoat composition.

The topcoat composition of the present invention further contains a compound having an Si atom and/or an F atom and having a function of increasing the contact angle on the surface of the topcoat film.

Also, the composition usually contains a solvent and may further contain, if desired, a surfactant and other components. These components are described below.

(B) Compound Containing an Si Atom and/or an F Atom and Having a Function of Increasing the Contact Angle on the Surface of the Topcoat Film The compound containing an Si atom and/or an F atom and having a function of increasing the contact angle (receding contact angle) on the surface of the topcoat film (hereinafter sometimes referred to as a "compound (B)") comes to be present on the film surface through diffusion or uneven distribution at the film formation from the topcoat composition containing the compound (B) and exerts a function of reducing the free energy on the film surface and increasing the contact angle for water.

The compound (B) preferably has no polar group in view of hydrophobing the surface.

Also, the compound (B) is preferably a resin.

The function of increasing the contact angle (receding contact angle) on the surface of the topcoat film indicates, for example, that when the topcoat film is formed by adding the compound (B) in amount of 1 part by mass based on 100 parts by mass of the total solid amount of the topcoat film but not including the solid amount of the compound (B), the compound (B) increases a receding contact angle of the topcoat film by 5.0% or more when compared with a receding contact angle of the topcoat film formed by the same topcoat composition except for not containing the compound (B). The measuring method of the receding contact angle is described later.

Whether or not the compound (B) has a function of increasing the contact angle is not determined only by the structural factors of the compound (B) but is determined by the relationship between the compound (B) and the resin (A). In general, the compound (B) has a larger amount of fluorine atom or silicon atom than the resin (A) and when the compound does not have a polar group (can contribute to the reduction in the surface free energy), exerts a function of increasing the contact angle. That is, for having a function of increasing the contact angle, the compound (B) preferably (1) has a larger amount of fluorine atom or silicon atom than the resin (A) and (2) is lower in the content of the polar group (number of polar groups/molecular weight) than the resin (A).

The contact angle (receding contact angle) of the topcoat film is preferably adjusted to be from 65 to 90°, more preferably 70° or more, still more preferably from 70 to 90°, yet still more preferably from 70 to 80°.

The advancing contact angle of the topcoat film is preferably adjusted to be from 70 to 120°, more preferably from 75 to 100°.

The advancing contact angle and receding contact angle defined here are advancing and receding contact angles measured by an expansion-contraction method. More specifically, a water droplet of 36 μL is produced by a syringe on a topcoat composition prepared on a silicon wafer at 23° C. and ejected or suctioned at a rate of 6 μL/sec, and a value when the contact angle during ejection or suction is stabilized is indicative of each contact angle.

The amount of the compound (B) added may be appropriately adjusted so that the receding angle of the topcoat film can fall in the range above, but the amount added is preferably from 0.1 to 10 mass %, more preferably from 0.1 to 5 mass %, based on the entire solid content of the topcoat composition.

Since it is preferred to contribute to enhancing the receding contact angle by the addition in a smaller amount, the glass transition point (Tg) of the compound (B) is preferably from 50 to 200° C.

The compound (B) is preferably a solid at ordinary temperature (25° C.).

The compound (B) is unevenly distributed to the interface in many cases but unlike a surfactant, needs not always have a hydrophilic group within the molecule and may not contribute to uniform mixing of polar/nonpolar substances.

The compound (B) is preferably a resin having at least either one of a fluorine atom and a silicon atom.

In the compound (B), the fluorine atom or silicon atom may be contained in the main chain of the resin or may be substituted in the side chain.

The compound (B) may be insoluble or soluble in an alkali developer but is preferably insoluble.

The term "insoluble in an alkali developer" means that the amount of a film of the compound (B) dissolved in an aqueous 2.38 mass % tetramethylammonium hydroxide solution at 23° C. is 10 nm or less as accumulated in 30 seconds from the initiation of development.

In order to be soluble in an alkali developer, the film of the compound (B) needs to have an alkali-soluble group in the development step. The compound (B) may previously contain an alkali-soluble group or may produce an alkali-soluble group by the action of an acid in the steps from exposure to development or by the reaction with an alkali developer.

The compound (B) is preferably a resin having, as the fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably from 1 to 4) is a linear or branched alkyl group with at least one hydrogen atom being substituted by a fluorine atom and may further have other substituents.

The fluorine atom-containing cycloalkyl group is a monocyclic or polycyclic cycloalkyl group with at least one hydrogen atom being substituted by a fluorine atom and may further have other substituents.

The fluorine atom-containing aryl group is an aryl group (e.g., phenyl, naphthyl) with at least one hydrogen atom being substituted by a fluorine atom and may further have other substituents.

Formulae of the fluorine atom-containing alkyl group, fluorine atom-containing cycloalkyl group and fluorine atom-containing aryl group are shown below, but the present invention is not limited thereto.

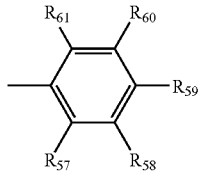

(F2)

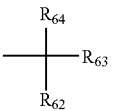

(F3)

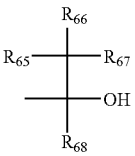

(F4)

In formulae (F2) to (F4), $R_{57}$ to $R_{68}$ each independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being substituted by a fluorine atom. It is preferred that all of $R_{57}$ to $R_{61}$ and all of $R_{65}$ to $R_{67}$ are a fluorine atom. $R_{62}$, $R_{63}$ and $R_{68}$ each is preferably an alkyl group (preferably having a carbon number of 1 to 4) with at least one hydrogen atom being substituted by a fluorine atom, more preferably a perfluoroalkyl group having a carbon number of 1 to 4. $R_{62}$ and $R_{63}$ may combine with each other to form a ring.

Specific examples of the group represented by formula (F2) include a p-fluorophenyl group, a pentafluorophenyl group and a 3,5-di(trifluoromethyl)phenyl group.

Specific examples of the group represented by formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-tert-butyl group, a perfluoroisopentyl group, a perfluorooctyl group, a perfluoro(trimethyl)hexyl group, a 2,2,3,3-tetrafluorocyclobutyl group and a perfluorocyclohexyl group. Among these, preferred are a hexafluoroisopropyl group, a heptafluoroisopropyl group, a hexafluoro(2-methyl)isopropyl group, an octafluoroisobutyl group, a nonafluoro-tert-butyl group and a perfluoroisopentyl group, more preferred are a hexafluoroisopropyl group and a heptafluoroisopropyl group.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

Specific examples of the repeating unit containing a group represented by formulae (F2) to (F4) are set forth below, but the present invention is not limited thereto.

In specific examples, $X_1$ represents a hydrogen atom, —CH$_3$, —F or —CF$_3$.

$X_2$ represents —F or —CF$_3$.

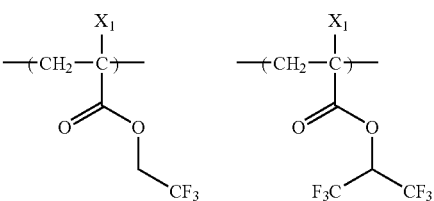

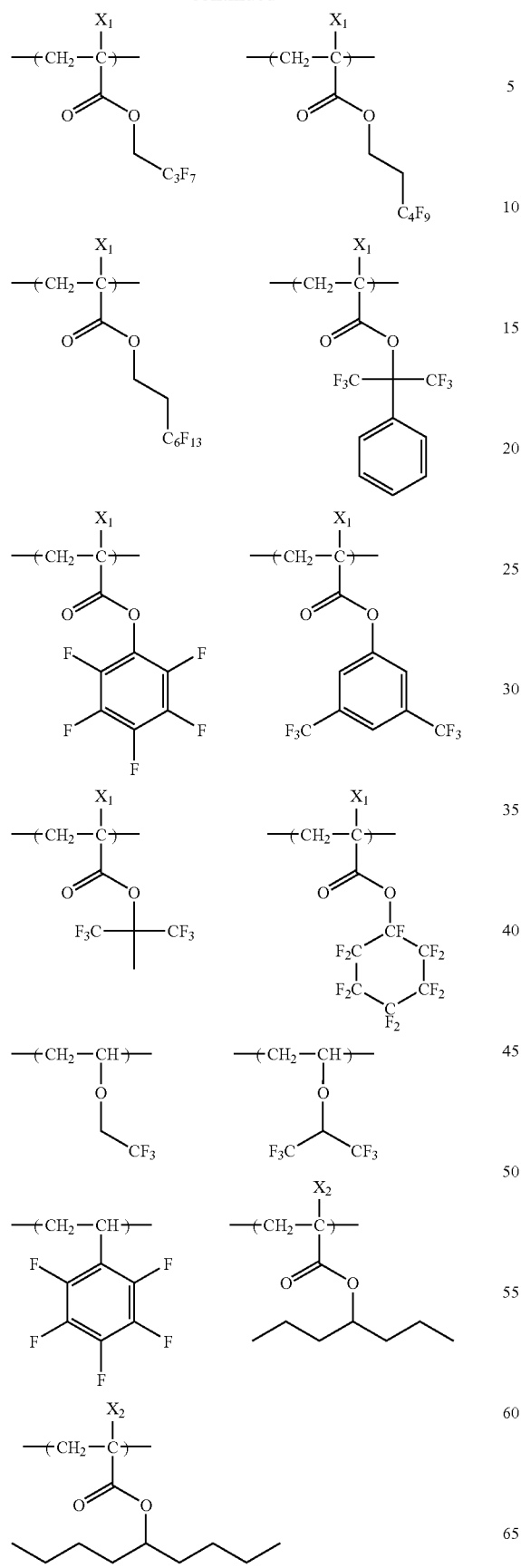
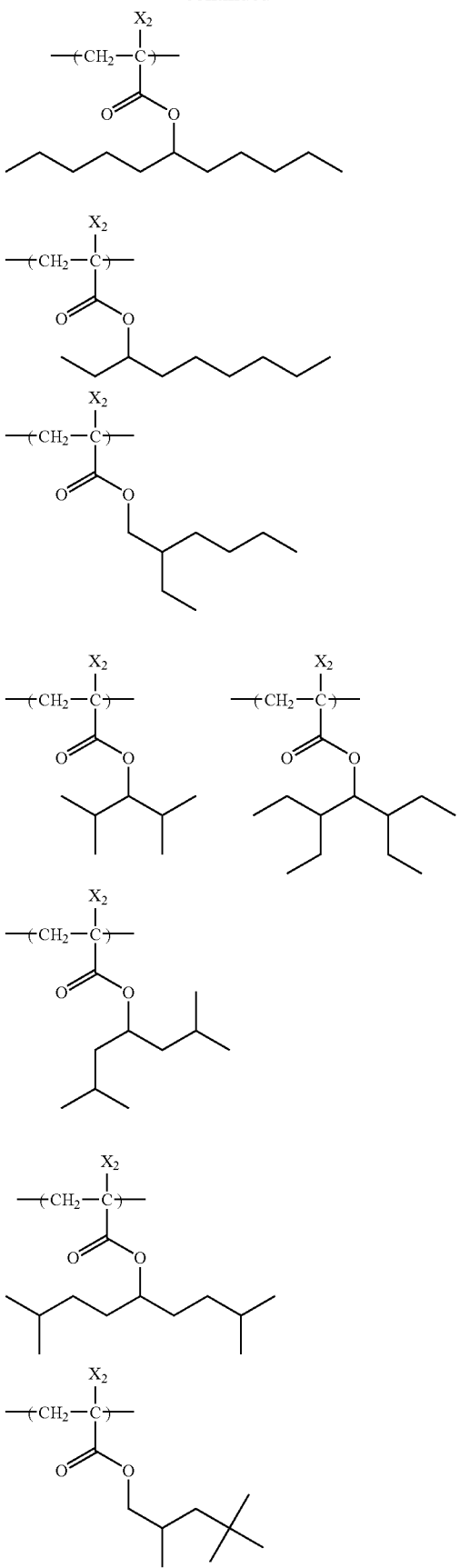

-continued

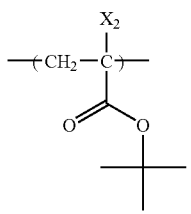

The compound (B) is preferably a resin having, as the silicon atom-containing partial structure, an alkylsilyl structure (preferably a trialkylsilyl group) or a cyclic siloxane structure.

Specific examples of the alkylsilyl structure and cyclic siloxane structure include the groups represented by the following formulae (CS-1) to (CS-3):

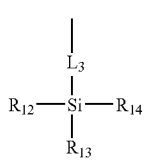
(CS-1)

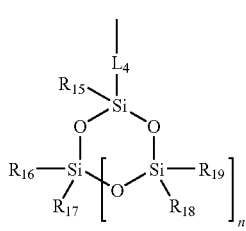
(CS-2)

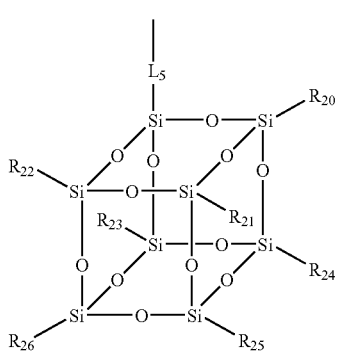
(CS-3)

In formulae (CS-1) to (CS-3), $R_{12}$ to $R_{26}$ each independently represents a linear or branched alkyl group (preferably having a carbon number of 1 to 20) or a cycloalkyl group (preferably having a carbon number of 3 to 20).

$L_3$ to $L_5$ each independently represents a single bond or a divalent linking group. The divalent linking group includes a sole group or a combination of two or more groups selected from the group consisting of an alkylene group, a phenylene group, an ether group, a thioether group, a carbonyl group, an ester group, an amide group, a urethane group and a ureylene group.

n represents an integer of 1 to 5.

Specific examples of the repeating unit having a silicon atom are set forth below, but the present invention is not limited thereto.

In specific examples, $X_1$ represents a hydrogen atom, —$CH_3$, —F or —$CF_3$.

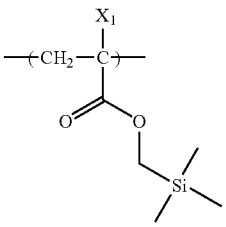
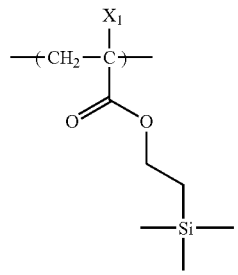

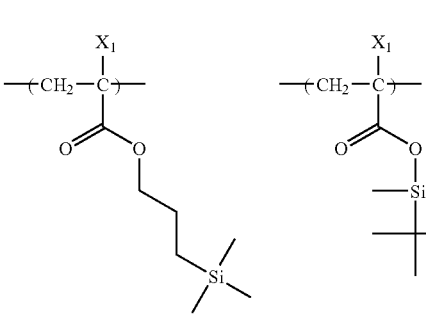

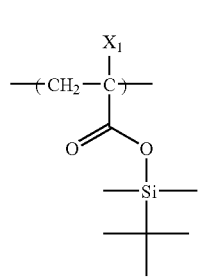

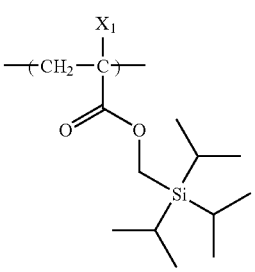

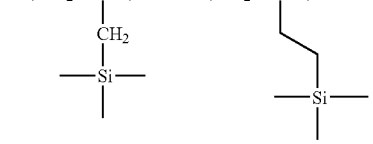

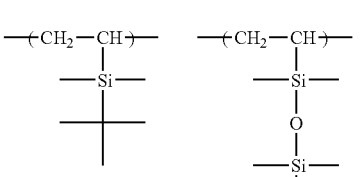

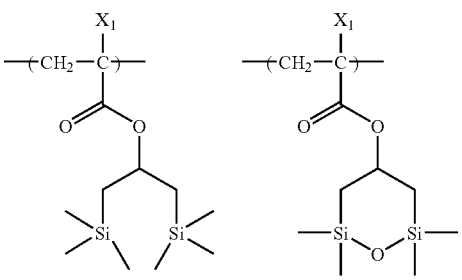

-continued

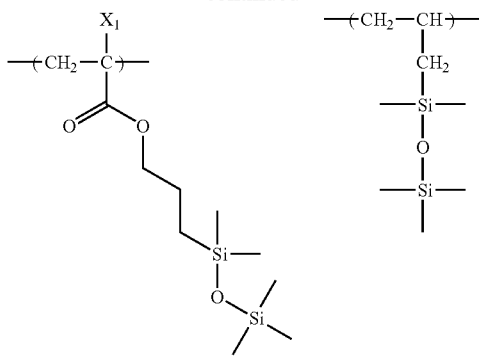

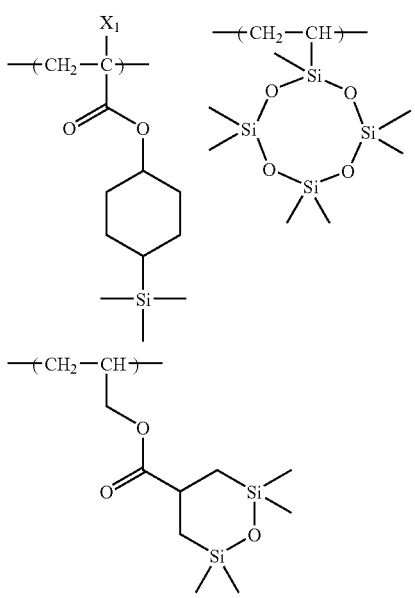

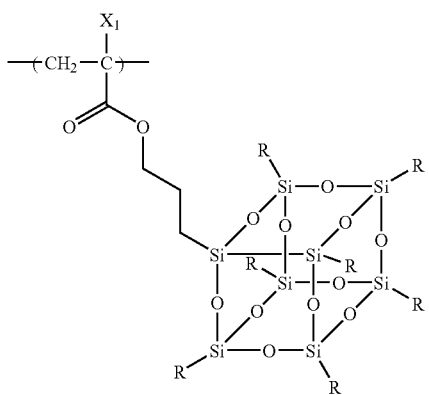

R = CH₃, C₂H₅, C₃H₇ or C₄H₉

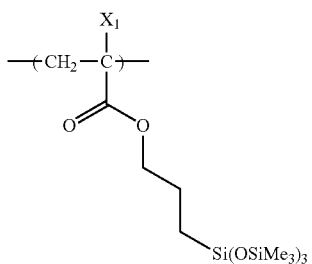

The compound (B) may further contain a repeating unit represented by the following formula (III):

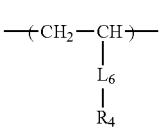

In formula (III), $R_4$ represents a group having an alkyl group, a cycloalkyl group, an alkenyl group or a cycloalkenyl group.

$L_6$ represents a single bond or a divalent linking group.

In formula (III), the alkyl group of $R_4$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The divalent linking group of $L_6$ is preferably an alkylene group (preferably having a carbon number of 1 to 5) or an oxy group.

In the case where compound (B) is a resin having a fluorine atom, the fluorine atom content is preferably from 5 to 80 mass %, more preferably from 10 to 80 mass %, based on the molecular weight of the compound (B). Also, the fluorine atom-containing repeating unit preferably occupies from 10 to 100 mass %, more preferably from 30 to 100 mass %, in the compound (B).

In the case where the compound (B) is a resin having a silicon atom, the silicon atom content is preferably from 2 to 50 mass %, more preferably from 2 to 30 mass %, based on the molecular weight of the compound (B). Also, the silicon atom-containing repeating unit preferably occupies from 10 to 100 mass %, more preferably from 20 to 100 mass %, in the compound (B).

The content of the polar group (number of polar groups (number of polar groups within one molecule)/molecular weight (molecular weight of one molecule; in the case of a resin, the weight average molecular weight)) in the compound (B) is preferably 80% or less of that in the resin (A).

The polar group as used herein indicates a hydroxy group, a carboxyl group, an amino group, an imino group, a nitro group, an azo group, an epoxy group, an oxo group, a carbonyl group, an ester group, a sulfonyl group, a sulfonylamide group, an acetal group or an amide group.

The content of the polar group in the resin (A) (number of polar groups/molecular weight) is preferably from 3.0E-03 to 12.0E-03, more preferably from 5.0E-03 to 9.0E-03.

The content of the polar group in the resin (B) (number of polar groups/molecular weight) is preferably from 1.0E-03 to 7.0E-03, more preferably from 1.5E-03 to 5.0E-03.

In the organic polymer material such as resist film and topcoat film, when the constituent compound of the composition has mobility in the process of film formation, the surface composition is optimized so that the film surface free energy can be minimized. Accordingly, by introducing a compound (B) having an Si atom and/or an F atom, that is designed to contribute to the reduction in the surface free energy, into the composition and allowing the compound (B) to be unevenly distributed to the surface during film formation, the surface can be hydrophobed. In order to impart such a property to the compound (B), it is particularly preferred that the compound (B) is designed not to contain a polar group.

The weight average molecular of the compound (B) in terms of standard polystyrene is preferably from 1,000 to 100,000, more preferably from 1,000 to 50,000, still more preferably from 2,000 to 15,000.

In the compound (B), as well as a small content of impurities such as metal, the content of the residual monomer or oligomer component is preferably from 0 to 10 mass %, more preferably from 0 to 5 mass %, still more preferably from 0 to 1 mass %. When these conditions are satisfied, a resist free from extraneous substances in liquid or change in the sensitivity or the like with aging can be obtained. Also, in view of resolution, resist profile, and side wall, roughness or the like of resist pattern, the molecular weight distribution (Mw/Mn, also called dispersity) is preferably from 1 to 5, more preferably from 1 to 3, still more preferably from 1 to 2.

As for the compound (B), various commercially available products may be used or the compound may be synthesized by an ordinary method (for example, radical polymerization). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include ethers such as tetrahydrofuran, 1,4-dioxane and diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the resist composition of the present invention. By the use of this solvent, generation of particles during storage can be suppressed.

The polymerization reaction is preferably performed in an inert gas atmosphere such as nitrogen and argon. As for the polymerization initiator, the polymerization is started using a commercially available radical polymerization initiator (e.g., azo-based polymerization initiator, peroxide). The radical polymerization initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The concentration in the reaction is from 5 to 50 mass %, preferably from 30 to 50 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of removing by extraction only polymers lower than a specific molecular weight; a reprecipitation method of adding dropwise the resin solution in a bad solvent to solidify the resin in the bad solvent and thereby remove residual monomers and the like; and a purification method in a solid state, such as washing of a resin slurry separated by filtration with a bad solvent. For example, the resin is precipitated as a solid through contact with a solvent in which the resin is sparingly soluble or insoluble (bad solvent) and which is in a volume amount of 10 times or less, preferably from 10 to 5 times, the reaction solution.

The solvent used at the operation of precipitation or reprecipitation from the polymer solution (precipitation or reprecipitation solvent) may be sufficient as long as it is a bad solvent for the polymer, and may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these, the precipitation or reprecipitation solvent is preferably a solvent containing at least an alcohol (particularly methanol or the like) or water.

The amount of the precipitation or reprecipitation solvent used may be appropriately selected by considering the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by considering the efficiency or operability, but the temperature is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under normal pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. More specifically, there may be used a method where after the completion of radical polymerization reaction, the polymer is put into contact with a solvent in which the polymer is sparingly soluble or insoluble, thereby precipitating a resin (step a), the resin is separated from the solution (step b) the resin is anew dissolved in a solvent to prepare a resin solution A (step c), the resin solution A is put into contact with a solvent in which the resin is sparingly soluble or insoluble and which is in a volume amount of less than 10 times (preferably a volume amount of times or less) the resin solution A, thereby precipitating a resin solid (step d), and the precipitated resin is separated (step e).

Specific examples of the compound (B) are set forth below. Also, the molar ratio of repeating units (sequentially corresponding to respective repeating units from the left), weight average molecular weight and dispersity in each compound (B) are shown in Table 1 below.

TABLE 1

| Resin | Composition | Mw | Mw/Mn |
|---|---|---|---|
| HR-1 | 50/50 | 8800 | 2.1 |
| HR-2 | 50/50 | 5200 | 1.8 |
| HR-3 | 50/50 | 4800 | 1.9 |
| HR-4 | 50/50 | 6300 | 1.9 |

TABLE 1-continued
| Resin | Composition | Mw | Mw/Mn |
|---|---|---|---|
| HR-5 | 100 | 5500 | 2.0 |
| HR-6 | 50/50 | 7500 | 1.9 |
| HR-7 | 70/30 | 10200 | 2.2 |
| HR-8 | 40/60 | 15000 | 2.2 |
| HR-9 | 80/20 | 11000 | 2.2 |
| HR-10 | 50/50 | 8000 | 2.2 |
| HR-11 | 50/50 | 7600 | 2.0 |
| HR-12 | 50/50 | 12000 | 2.0 |
| HR-13 | 20/80 | 6500 | 1.8 |
| HR-14 | 100 | 6500 | 1.2 |
| HR-15 | 100 | 6000 | 1.6 |
| HR-16 | 100 | 2000 | 1.6 |
| HR-17 | 50/50 | 6000 | 1.7 |
| HR-18 | 50/50 | 8800 | 1.9 |
| HR-19 | 50/50 | 7800 | 2.0 |
| HR-20 | 80/20 | 8000 | 1.8 |
| HR-21 | 30/70 | 7000 | 1.7 |
| HR-22 | 50/50 | 6500 | 1.6 |
| HR-23 | 50/50 | 6500 | 1.6 |
| HR-24 | 50/50 | 9000 | 1.8 |
| HR-25 | 100 | 10000 | 1.6 |
| HR-26 | 70/30 | 8000 | 2.0 |
| HR-27 | 10/90 | 8000 | 1.8 |
| HR-28 | 30/30/40 | 9000 | 2.0 |
| HR-29 | 50/50 | 6000 | 1.4 |
| HR-30 | 50/50 | 5500 | 1.5 |
| HR-31 | 50/50 | 4800 | 1.8 |
| HR-32 | 50/50 | 10600 | 1.9 |
| HR-33 | 50/50 | 8000 | 1.5 |
| HR-34 | 20/80 | 7500 | 1.8 |
| HR-35 | 50/50 | 6200 | 1.6 |
| HR-36 | 60/40 | 16000 | 1.8 |
| HR-37 | 80/20 | 10200 | 1.8 |
| HR-38 | 50/50 | 12000 | 2.6 |
| HR-39 | 50/50 | 6000 | 1.4 |
| HR-40 | 50/50 | 4500 | 1.4 |
| HR-41 | 100 | 2300 | 2.6 |
| HR-42 | 100 | 15000 | 2.1 |
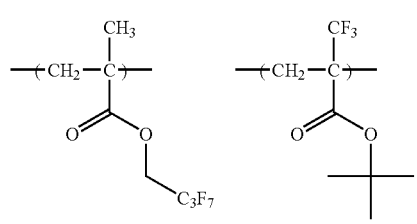
(HR-1)
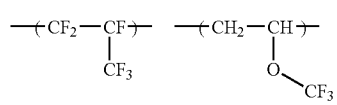
(HR-2)
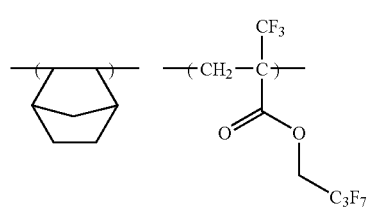
(HR-3)
(HR-4)
(HR-5)
(HR-6)
(HR-7)
(HR-8)

TABLE 1-continued
| Resin | Composition | Mw | Mw/Mn |
|---|---|---|---|
(HR-9)
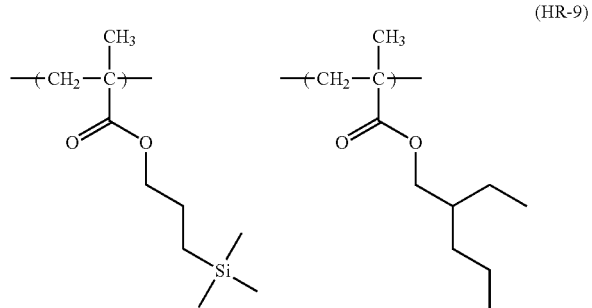
(HR-10)
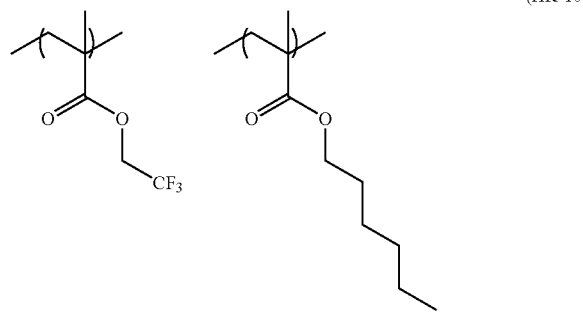
(HR-11)
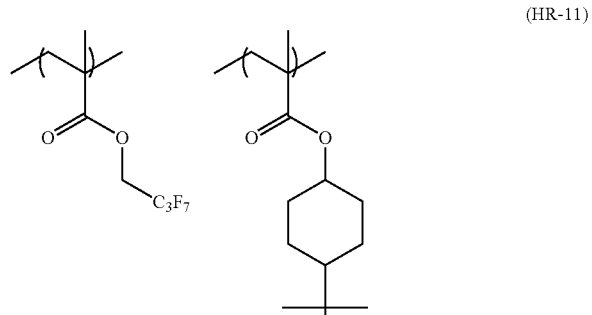
(HR-12)
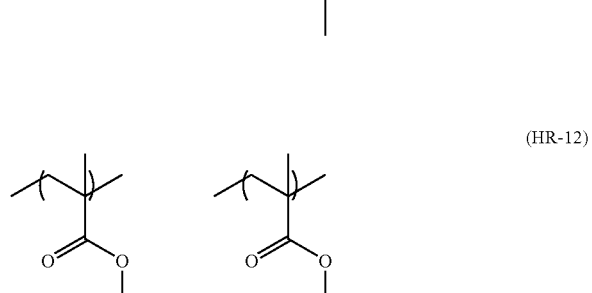
TABLE 1-continued
| Resin | Composition | Mw | Mw/Mn |
|---|---|---|---|
(HR-13)
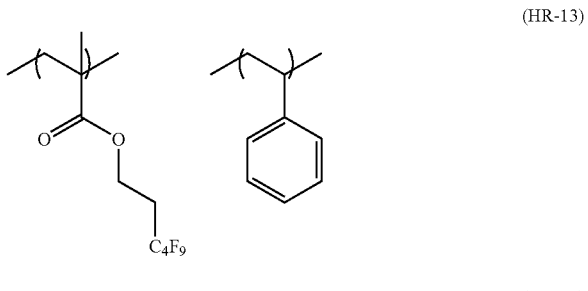
(HR-14)
(HR-15)
(HR-16)
(HR-17)
(HR-18)

TABLE 1-continued
| Resin | Composition | Mw | Mw/Mn |
|---|---|---|---|
(HR-19)
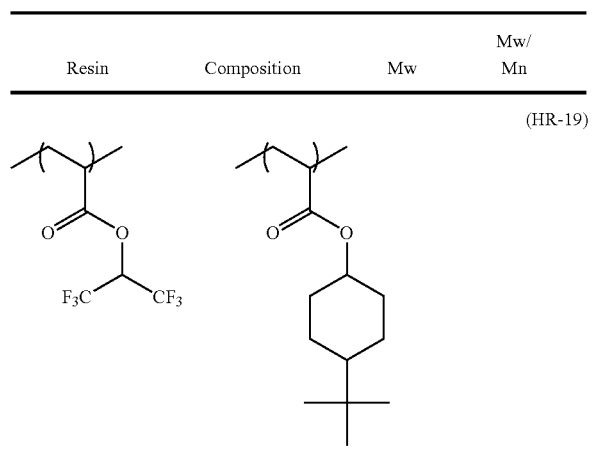
(HR-20)
(HR-21)
(HR-22)
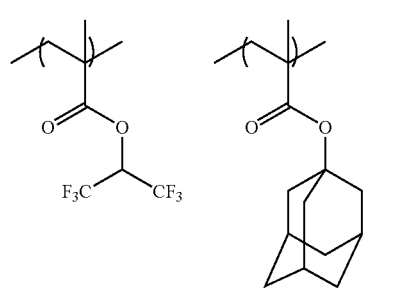
(HR-23)
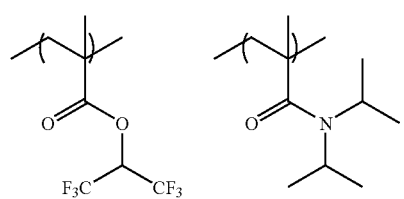
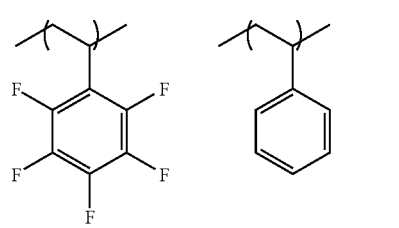
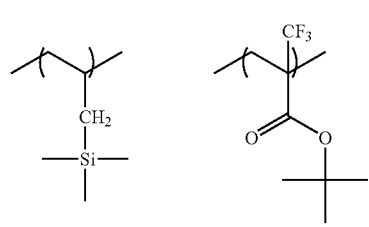
TABLE 1-continued
| Resin | Composition | Mw | Mw/Mn |
|---|---|---|---|
(HR-24)
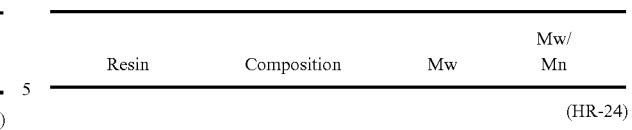
(HR-25)
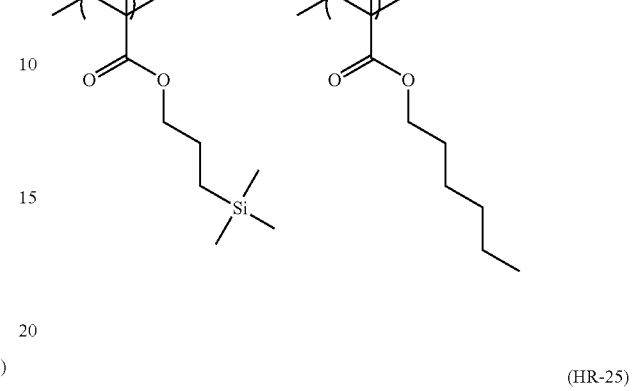
(HR-26)
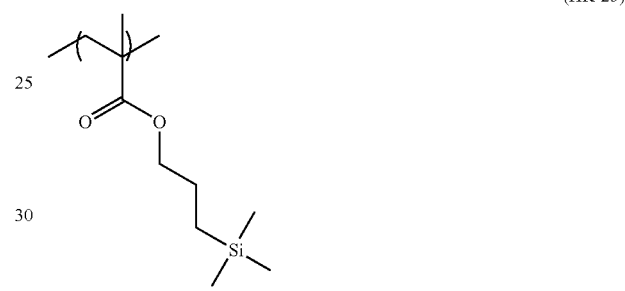
(HR-27)
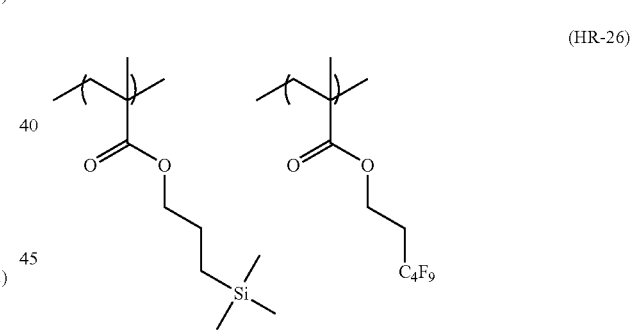
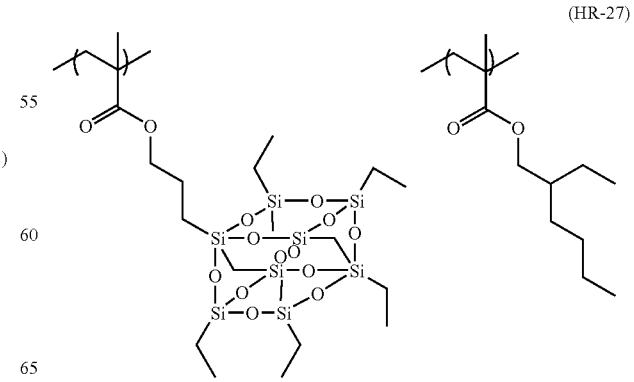

TABLE 1-continued
| Resin | Composition | Mw | Mw/Mn |
|---|---|---|---|
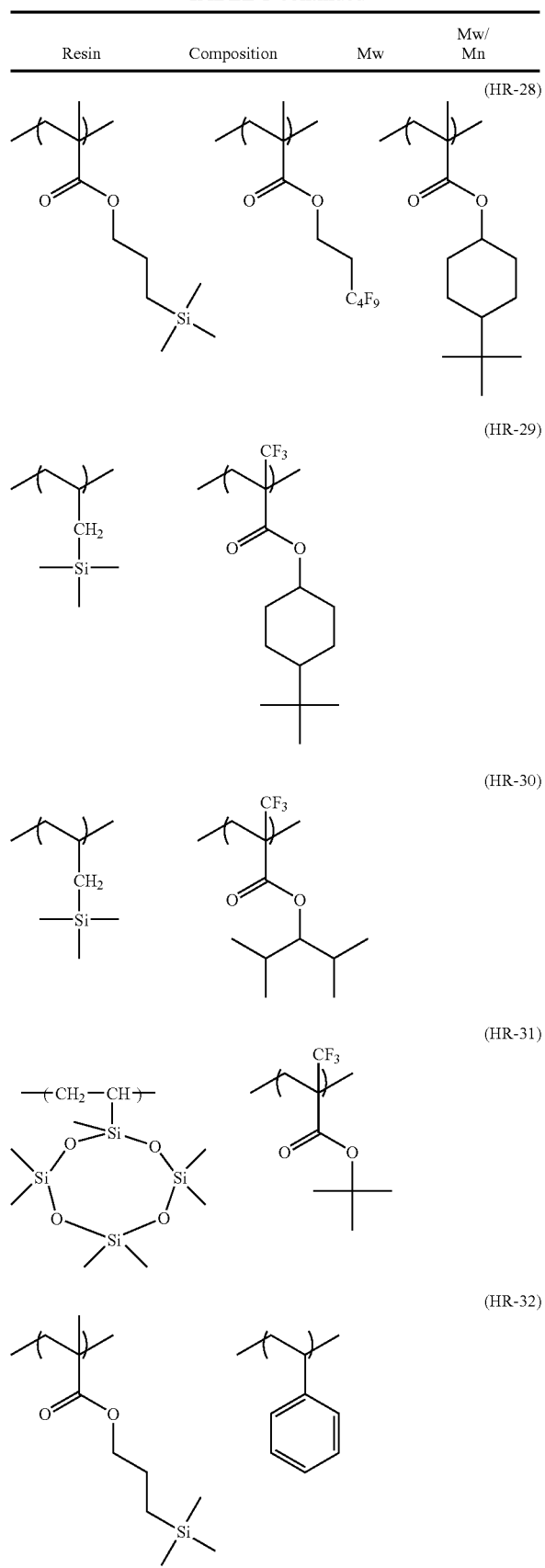
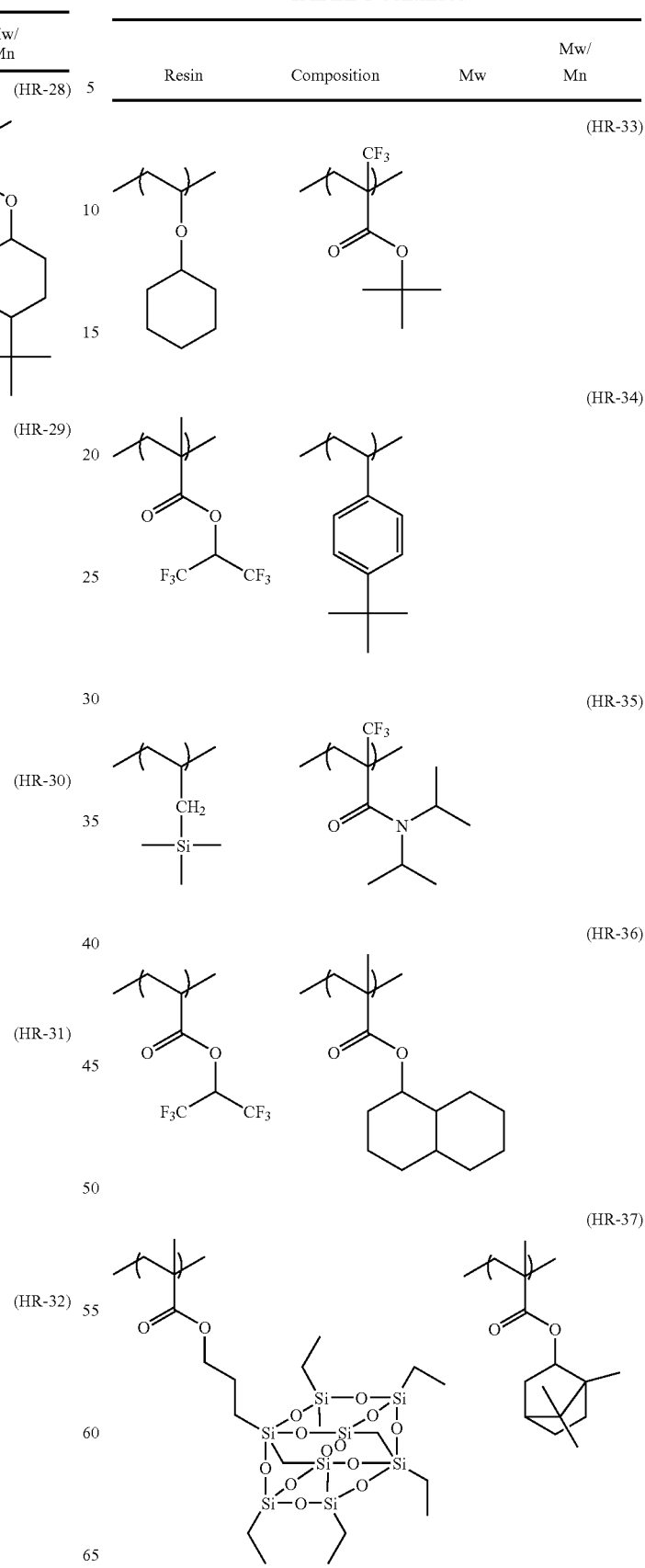

TABLE 1-continued

| Resin | Composition | Mw | Mw/Mn |
|---|---|---|---|
| (HR-38) | 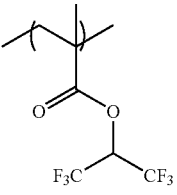 | | |
| (HR-39) | 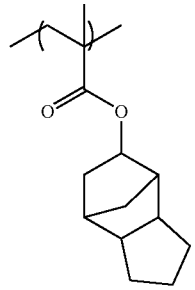 | | |
| (HR-40) | 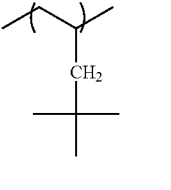 | | |
| (HR-41) | 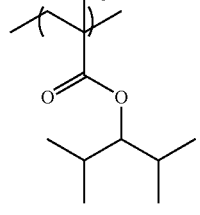 | | |
| (HR-42) | 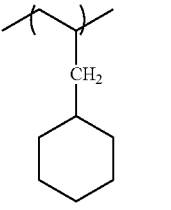 | | |

(C) Solvent

The topcoat composition of the present invention is usually prepared by dissolving the components above in a predetermined organic solvent. The solvent is preferably different from the organic solvent used in the resist so as to avoid admixture with the resist. From the standpoint of preventing elution into the immersion liquid, the solvent is preferably non-water-soluble. A solvent having a boiling point of 100 to 200° C. is preferred.

Examples of the solvent which can be used include the followings:

a hydrocarbon-based solvent such as benzene, toluene, ethylbenzene, amylbenzene, isopropylbenzene, hexane, heptane, octane, nonane, decane, dodecane, cyclohexane, methylcyclohexane, p-menthane, decalin, xylene, cyclohexylbenzene, cyclohexene, cyclopentane, dipentene, naphthalene, dimethylnaphthalene, cymene, tetralin, biphenyl and mesitylene;

a halogenated hydrocarbon solvent such as methylene chloride, hexyl chloride, chlorobenzene and bromobenzene;

an alcohol-based solvent such as amyl alcohol, isoamyl alcohol, butanol, hexanol, 3-heptanol, i-butyl alcohol, 2-ethylbutanol, 2-ethylhexanol, octanol, nonanol, neopentyl alcohol, cyclohexanol and tetrahydrofurfuryl alcohol a nitrogen-containing solvent such as acetonitrile, isopropanolamine, ethylhexylamine, N-ethylmorpholine, diisopropylamine, cyclohexylamine, di-n-butylamine, tetramethylethylenediamine and tripropylamine;

a carboxylic acid-based solvent such as formic acid, acetic acid, butyric acid, isobutyric acid, itaconic acid and propionic acid;

an acid anhydride-based solvent such as acetic anhydride, propionic anhydride and itaconic anhydride;

a fluorine-based solvent such as 1,4-difluorobenzene, 1,1,2,2-tetrachlorodifluoroethane, tetrafluoropropanol, ethyl trifluoroacetoacetate, perfluoroheptane, hexafluoroisopropanol, perfluorobutylethanol, pentafluoropropanol, hexafluorobenzene, perfluorobutyltetrahydrofuran, perfluoropolyethers and fluorophenols; and other solvents such as anisole, dioxane, dioxolan, dibutyl ether, ethyl-n-butyl ketone, diacetone alcohol, diisobutyl ketone, methyl isobutyl ketone, methyl-n-butyl ketone, ethylene glycol, diglycidyl ether, ethylene dichloride, cyclohexanone, cyclopentanone, 2-heptanone, γ-butyrolactone, methyl ethyl ketone, ethylene glycol, ethylene glycol monomethyl ether, ethylene glycol monoethyl ether, 2-methoxyethyl acetate, ethylene glycol monoethyl ether acetate, propylene glycol, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, methoxybutanol, tetrahydrofuran, ethylethoxy propionate, butyl acetate and N,N-dimethylacetamide.

In the present invention, the solvent contained is preferably an alcohol-based solvent, more preferably 1-octanol, 2-octanol or 4-methyl-2-pentanol. The alcohol-based solvent indicates a solvent having an alcoholic hydroxyl group in the molecular structure.

From the standpoint of more enhancing the effects of the present invention, a plurality of the solvents for use in the topcoat composition of the present invention are preferably mixed and used as a mixed solvent. The mixed solvent is not particularly limited but is preferably a mixed solvent obtained by adding a polar solvent such as alcohol-based solvent, ether-based solvent, nitrogen-containing solvent, carboxylic acid-based solvent, acid anhydride solvent, ester-based solvent or ketone-based solvent, to a nonpolar solvent such as hydrocarbon-based solvent, halogenated hydrocarbon solvent or fluorine-containing nonpolar solvent.

Preferred examples of the nonpolar solvent include the followings:

a hydrocarbon-based solvent such as benzene, toluene, ethylbenzene, amylbenzene, isopropylbenzene, hexane, heptane, octane, nonane, decane, dodecane, cyclohexane, methylcyclohexane, p-menthane, decalin, xylene, cyclohexylbenzene, cyclohexene, cyclopentane, dipentene, naphthalene, dimethylnaphthalene, cymene, tetralin, biphenyl and mesitylene;

a halogenated hydrocarbon solvent such as chloroform, hexyl chloride, ethylene dichloride, chlorobenzene, bromobenzene and iodobenzene; and a fluorine-containing nonpolar solvent such as 1,4-difluorobenzene, 1,1,2,2-tetrachlorodifluoroethane, perfluoroheptane, hexafluorobenzene and perfluorobutyltetrahydrofuran.

Preferred examples of the polar solvent include the followings:

an alcohol-based solvent such as amyl alcohol, isoamyl alcohol, butanol, hexanol, 3-heptanol, i-butyl alcohol, 2-ethylbutanol, 2-ethylhexanol, octanol, nonanol, neopentyl alcohol, cyclohexanol, tetrahydrofurfuryl alcohol, ethylene glycol, propylene glycol, tetrafluoropropanol, hexafluoroisopropanol, perfluorobutylethanol, pentafluoropropanol and fluorophenol;

an ether-based solvent such as anisole, dioxane, dioxolan, dibutyl ether and tetrahydrofuran;

a nitrogen-containing solvent such as acetonitrile, isopropanolamine, ethylhexylamine, N-ethylmorpholine, diisopropylamine, cyclohexylamine, di-n-butylamine, tetramethylethylenediamine and tripropylamine;

a carboxylic acid-based solvent such as formic acid, acetic acid, butyric acid, isobutyric acid, itaconic acid and propionic acid;

an acid anhydride-based solvent such as acetic anhydride, propionic anhydride and itaconic anhydride;

an ester-based solvent such as ethyl acetate, methyl lactate, ethyl lactate, methyl methoxypropionate, ethyl ethoxypropionate, methyl pyruvate, ethyl pyruvate, propyl pyruvate and γ-butyrolactone;

a ketone-based solvent such as ethyl-n-butyl ketone, diisobutyl ketone, methyl isobutyl ketone, methyl-n-butyl ketone, cyclohexanone, cyclopentanone, 2-heptanone and methyl ethyl ketone; and other polar solvents such as ethylene glycol monomethyl ether, ethylene glycol monoethyl ether 2-methoxyethyl acetate, ethylene glycol monoethyl ether acetate, N,N-dimethylformamide, dimethyl sulfoxide, N-methylpyrrolidone, methoxybutanol, ethylethoxy propionate and N,N-dimethylacetamide.

The combination of the polar solvent and the nonpolar solvent is not particularly limited but is preferably a combination using the above-described hydrocarbon-based solvent or fluorine-containing nonpolar solvent as the nonpolar solvent and using the above-described alcohol-based solvent as the polar solvent.

The mixing ratio of solvents in the mixed solvent is preferably, in terms of mass ratio of nonpolar solvent:polar solvent, from 95:5 to 40:60, more preferably from 90:10 to 50:50, still more preferably from 85:15 to 60:40.

Surfactant:

The topcoat composition of the present invention may further contain a surfactant. As for the surfactant, the composition preferably contains any one fluorine-containing and/or silicon-containing surfactant (a fluorine-containing surfactant, a silicon-containing surfactant, or a surfactant containing both a fluorine atom and a silicon atom), or two or more species thereof. The surfactant contained contributes to enhancing the performance such as sensitivity, resolution, adherence and development defect suppression, in particular, coating uniformity, when using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430 and 431 (produced by Sumitomo 3M Inc.); Megaface F171, F173, F176, F189 and ROB (produced by Dainippon Ink & Chemicals, Inc.); Surflon S-382, SC101, 102, 103, 104, 105 and 106 (produced by Asahi Glass Co., Ltd.); and Troysol S-366 (produced by Troy Chemical). In addition, polysiloxane polymer KP-341 (produced by Shin-Etsu Chemical Co., Ltd.) may also be used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), a copolymer of a $C_6F_{13}$ group-containing acrylate (or methacrylate) with a (poly(oxyethylene)) acrylate (or methacrylate) and a (poly(oxypropylene)) acrylate (or methacrylate), a copolymer of a $C_8F_{17}$ group-containing acrylate (or methacrylate) with a (poly(oxyalkylene)) acrylate (or methacrylate), and a copolymer of a $C_8F_{17}$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.polyoxypropylene block copolymers, sorbitan aliphatic acid esters (e.g., sorbitan monolaurate, sorbitan monopalmitate, sorbitan monostearate, sorbitan monooleate, sorbitan trioleate, sorbitan tristearate) and polyoxyethylene sorbitan aliphatic acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or some of these may be used in combination.

The amount of the surfactant used is preferably from 0.0001 to 2 mass %, more preferably from 0.001 to 1 mass %, based on the entire amount of the topcoat composition (excluding the solvent)

Topcoat Film:

The topcoat composition of the present invention is, for example, coated on a resist film to prevent the immersion liquid from permeating into the inside of the resist film and prevent the resist film components from dissolving out into the immersion liquid.

In the topcoat composition of the present invention, the content of metal impurities contained in the composition is preferably 100 ppb or less. Examples of the metal impurity which is likely to be contained in the topcoat composition include Na, K, Ca, Fe, Mg, Mn, Pd, Ni, Zn, Pt, Ag and Cu. Above all, it is more preferred to suppress the content of iron (Fe) to 20 ppb or less.

When the content of metal impurities in the topcoat composition is reduced, the coating uniformity is improved, and this is presumed to result because the metal impurity in the topcoat composition is prevented from becoming a core in generation of coating unevenness such as striation at spin coating. When the content of metal impurities in the topcoat composition is reduced, the number of particles generated can be reduced, and this is presumed to result because aggregation of the resin in the solvent is inhibited from occurring around the metal impurity along with temporal change.

Also, the cause of bringing about enhancement in the sensitivity of the underlying resist when reducing the content of metal impurities in the topcoat composition is not clarified, but the reduction in the metal impurity content is considered to provide an effect of preventing a reaction of converting the resist into a negative resist from being accelerated through some chemical interaction between a metal impurity including iron when present in the topcoat composition and the underlying resist surface upon irradiation of a high-energy photon.

Examples of the method for reducing the content of metal impurities contained in the topcoat composition to 100 ppb or less include a method of dissolving the resin (A) in a solvent to prepare a solution and filtering the solution through an ion exchange filter. Other known examples include increase of the purity of materials used, liquid separation-washing, and treatment with an acidic ion exchange resin or a chelate resin. Accordingly, the production method of the topcoat composition of the present invention includes, for example, a production method of a topcoat composition, comprising a step of filtering a solution containing the resin (A) through an ion exchange filter, a step of adding, if desired, a surfactant and the like to the solution to prepare a mixed solution, and a step of filtering the mixed solution through a filter for removing insoluble colloid.

The ion exchange filter which can be used in the present invention is preferably a cation exchange-type filter where an ion exchange group is fixed to a polyethylene-made porous film or a polypropylene-made porous film, and examples thereof include Ion Clean (produced by Nihon Pall Ltd.) and Ion Clean AQ (produced by Nihon Pall Ltd.), but the present invention is not limited thereto.

The filtration speed through the ion exchange filter is preferably from 500 to 10,000 cc/min/m$^2$.

The filter for removing insoluble colloid, which can be used in the present invention, is preferably a synthetic resin-made filter, and examples thereof include Mykrolis Optimizer DEV-16/40 (polyethylene filter, produced by Mykrolis Corp.), Mykroguard Minichem (polyethylene filter, produced by Mykrolis Corp.), Emflon (polytetrafluoroethylene filter produced by Nihon Pall Ltd.), Ultipor N66 (nylon 66 filter, produced by Nihon Pall Ltd.), Zeta Plus (cellulose filter, produced by CUNO K.K.), Electropor II (nylon 66 filter, produced by CUNO K.K.), but the present invention is not limited thereto. In the case of performing the filtration step after adding an ionic compound such as photo-acid generator, the filter for removing insoluble colloid preferably has no ion exchange capability.

In both the ion exchange-type filter and the filter for removing insoluble colloid, the pore size is preferably from 0.01 to 0.5 μm, more preferably from 0.01 to 0.1 μm.

The method for applying the topcoat composition of the present invention on a resist is appropriately selected according to the process applied and is not particularly limited, and a method such as spin coating may be used.

From the standpoint that the topcoat film is preferably transparent to the exposure light source, a thinner film is preferred, and the topcoat film is usually formed to a thickness of 1 to 300 nm, preferably from 10 to 150 nm. More specifically, the film is preferably formed to a thickness such that the transmittance of the exposure light becomes from 50 to 80%, more preferably from 60 to 70%. The transmittance of exposure light can be adjusted by adjusting the polymerization components of the resin. For example, the transmittance of ArF light can be increased by decreasing the amount of an aromatic ring contained in the resin.

Also, in order to prevent contamination of the immersion liquid or lens by a substance dissolved out from the topcoat film, a substance dissolved out from the topcoat film is preferably not present. In the light of preventing elution of a substance, the content of a low molecular weight compound (for example, a compound having a molecular weight of 1,000 or less) in the topcoat film is preferably smaller.

In view of affinity of the topcoat film for the immersion liquid, the contact angle (at 23° C.) of the immersion liquid for the topcoat film is preferably from 50 to 80°, more preferably from 60 to 80°. The contact angle can be adjusted to the range above by adjusting the amount of the acid group or by controlling the hydrophilicity or hydrophobicity of the copolymer component.

The refractive index of the topcoat film is preferably close to the refractive index of the resist film in view of resolution. The refractive index can be adjusted by controlling the components of the topcoat composition, particularly the resin composition and the ratio of repeating units.

The topcoat composition preferably enables uniform coating when forming a topcoat film. The coatability (coating uniformity) can be improved by appropriately selecting the kind of solvent, the surfactant and other additives and adjusting the amount added thereof.

The topcoat composition is coated on a resist film to form a film and therefore, is preferably not mixed with the resist film.

The coverage of the compound (B) on the surface of the topcoat film is preferably 30% or more.

The coverage of the compound (B) on the surface of the topcoat film is defined as follows.

First, a topcoat composition comprising only a resin (A) and a solvent (C) is prepared, and the contact angle at the film formation is measured by the following procedure. On a substrate obtained by forming a 250 nm-thick photoresist film (GAR-8101G1, produced by Fujifilm Electronics Materials Co., Ltd.) on a silicon wafer, the prepared topcoat composition is coated and baked at 100° C. for 60 seconds to form a topcoat film of about 50 nm in thickness. Using a static contact angle meter (manufactured by Kyowa Interface Science Co., Ltd.), a water droplet in a droplet size of 10 μL is landed using a syringe, and the contact angle 10 seconds after landing is measured at 23° C. (this value is denoted by CA0).

Next, a topcoat composition comprising a resin (A) and a solvent (C), where a compound (B) is added in an amount of 0.1 mass % based on the solid content of the resin (A), is prepared, and the contact angle is measured by the same method.

Furthermore, a topcoat composition comprising a resin (A) and a solvent (C), where a compound (B) is added in an amount of 0.2 mass % based on the solid content of the resin (A), is prepared, and the contact angle is measured by the same method.

Similarly, topcoat compositions where the amount of the compound (B) is increased in steps of 0.1 mass % based on the solid content of the resin (A) are sequentially measured for the contact angle.

Using the results obtained, the contact angle is plotted with respect to the amount of the compound (B) added and when the compound (B) has a tendency to diffuse and unevenly distribute to the surface, a graph as shown in FIG. 1 is obtained.

Assuming that the static contact angle at the film formation of the topcoat composition when the compound (B) is added in an arbitrary amount is CAt (CAmax≥CAt≥CA0), the coverage here of the compound (B) on the film surface is defined as follows.

Coverage (%)=(CAt−CA0)/(CAmax−CA0)

Incidentally, in the case where enhancement of the contact angle is not obtained even when the compound (B) is added (CAmax≤CA0), the coverage is 0(%).

Pattern Forming Method:

The topcoat composition of the present invention is usually used by dissolving the components above in a solvent and applying the solution on a resist film on a substrate.

More specifically, a resist composition for immersion exposure is coated on such a substrate as used in the production of a precision integrated circuit device by an appropriate coating method such as spinner or coater to an arbitrary thickness (usually from 50 to 500 nm). At this time, it is also preferred to provide an appropriate antireflection film on a substrate and then form a resist film thereon. After the coating, the coated film is dried by spin or baking, whereby a resist film is formed.

Furthermore, similarly to the resist composition, the topcoat composition is coated on the resist film by using a spinner, a coater or the like and dried by spin or baking to form a topcoat film.

The resist film is then subjected to exposure through an immersion liquid (immersion exposure) with the intervention of a mask for pattern formation. The exposure amount can be appropriately set but is usually from 1 to 100 mJ/cm$^2$. After the exposure, spin or/and baking are preferably applied, and the resist film is then subjected to development and rinsing to obtain a pattern. In the present invention, the topcoat film is dissolved and separated with a developer in the developing step and therefore, there is no need to specially provide a separation step.

After the exposure, baking is preferably performed, and the baking temperature is usually from 30 to 300° C. In view of change in the line width of the resist pattern due to fluctuation of the post exposure delay (PED) from exposure to development, the time from exposure to baking step is preferably shorter.

The exposure light is preferably a far ultraviolet ray at 250 nm or less, more preferably at 220 nm or less. Specific examples thereof include KrF excimer laser light (248 nm), ArF excimer laser light (193 nm), F$_2$ excimer laser light (157 nm) and X-ray.

Examples of the substrate which can be used include a normal bare Si substrate, an SOG substrate and a substrate with an antireflection film.

The antireflection film which can be used includes an inorganic film type such as titanium, titanium dioxide, titanium nitride, chromium oxide, carbon and α-silicon, and an organic film type comprising a light absorbent and a polymer material. The former requires equipment for the film formation, such as vacuum deposition apparatus, CVD apparatus and sputtering apparatus. Examples of the organic antireflection film include a film comprising a diphenylamine derivative and formaldehyde-modified melamine resin condensate, an alkali-soluble resin and a light absorbent described in JP-B-7-69611, a reaction product of a maleic anhydride copolymer and a diamine-type light absorbent described in U.S. Pat. No. 5,294,680, a film containing a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising methylolmelamine and a benzophenone-based light absorbent described in JP-A-8-7115, and a film obtained by adding a low molecular light absorbent to a polyvinyl alcohol resin described in JP-A-8-179509.

Also, the organic antireflection film may be a commercially available organic antireflection film such as DUV30 Series, DUV-40 Series and ARC25 produced by Brewer Science, Inc., and AC-2, AC-3, AR19 and AR20 produced by Shipley Co., Ltd.

The immersion liquid used in the immersion exposure is described below.

The immersion liquid (e.g., water) is preferably a liquid being transparent to light at the exposure wavelength and having a temperature coefficient of refractive index as small as possible so as to minimize the distortion of an optical image projected on the resist, Particularly, when the exposure light source is an ArF excimer laser (wavelength: 119 nm), water is preferably used in view of easy availability and easy handleability, in addition to the above-described aspects.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the under-surface of the lens element, may be added in a small ratio. The additive is preferably an aliphatic alcohol having a refractive index nearly equal to that of water, and specific examples thereof include methyl alcohol, ethyl alcohol and isopropyl alcohol. By adding an alcohol having a refractive index nearly equal to that of water, even when the alcohol component in water is evaporated and its concentration is changed, the change in the refractive index of the liquid as a whole can be advantageously made very small. On the other hand, if a substance opaque to light at 193 nm or an impurity greatly differing in the refractive index from water is mingled, this incurs distortion of the optical image projected on the resist. Therefore, water used is preferably distilled water. Pure water after further filtration through an ion exchange filter or the like may also be used.

The electrical resistance of water is preferably 18.3 MΩ·cm or more, and TOC (organic material concentration) is preferably 20 ppb or less. Also, the water is preferably subjected to a deaeration treatment.

The alkali developer which can be used in the developing step is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, and cyclic amines such as pyrrole and piperidine.

Furthermore, this alkaline aqueous solution may be used after adding thereto an appropriate amount of alcohols or a surfactant.

The alkali concentration of the alkali developer is usually from 0.1 to 20 mass %.

The pH of the alkali developer is usually from 10.0 to 15.0.

As for the rinsing solution, pure water may be used, and the pure water may also be used after adding thereto an appropriate amount of a surfactant.

After the development or rinsing, the developer or rinsing solution adhering on the pattern may removed by a supercritical fluid.

In the immersion exposure using the topcoat film of the present invention, the resist is not particularly limited and may be arbitrarily selected from those usually employed, and the resist may be either a positive resist or a negative resist.

As for the resist, a positive or negative resist sufficiently provided with various requisite properties enabling application to the recent ultrafine processing may be preferably used. In the present invention, above all, a chemical amplification-type resist can be used, and a positive resist is more preferred.

The chemical amplification-type resist is typified by a resist using a so-called acid generator capable of generating an acid by the action of an active energy ray such as light. For example, as for the negative chemical amplification-type resist, a three-component system composed of a base polymer, a photo-acid generator and a crosslinking agent is used, where at the exposure of the resist, the acid generated in the exposed area upon irradiation with light brings about a crosslinking reaction and acts to decrease the solubility in a developer. On the other hand, the positive chemical amplification-type resist usually includes a two-component system composed of a base polymer having a site blocked with a protective group having a dissolution-inhibiting function and a photo-acid generator, and a three-component system composed of the base polymer, an acid generator and a dissolution-inhibiting agent, where at the exposure of the resist, the acid generated in the exposed area upon irradiation with light acts to remove the protective group of the polymer and increase the solubility in a developer.

In the case where the exposure light source is an ArF excimer laser (wavelength: 193 nm), a two-component system composed of a resin capable of being solubilized in an alkali developer by the action of an acid, and a photo-acid generator is preferred. In particular, the resin capable of being solubilized in an alkali developer by the action of an acid is preferably an acrylic or methacrylic resin having a monocyclic or polycyclic alicyclic hydrocarbon structure, and a resin having a lactone residue or an adamantane residue is more preferred.

Incidentally, the resist pattern formed preferably has no electrical conductivity and therefore, the resist is preferably free from a metal. The amount of the metal contained is preferably 100 ppb or less, more preferably 50 ppb or less. The amount of the metal can be suppressed by normal purification such as increase of the purity of materials used or filtration.

EXAMPLES

The present invention is described in greater detail below by referring to Examples, but the present invention should not be construed as being limited thereto.

Synthesis Example 1

Synthesis of Resin (A-73)

4-[Bis(trifluoromethyl)hydroxymethyl]styrene (8.11 g (0.03 mol)) and 10.93 g (0.07 mol) of tetrahydro-5-oxofuran-3-yl acrylate were dissolved in 250 ml of propylene glycol monomethyl ether and 0.25 g of 2,2'-azobis(2,4-dimethylvaleronitrile (V-65, trade name, produced by Wako Pure Chemical Industries, Ltd.) as a polymerization initiator was added thereto. The resulting solution was stirred at 70° C. for 4 hours in a nitrogen stream. Thereafter, the reaction solution was poured in 1 L of hexane while vigorously stirring, and the precipitated resin was washed with ion exchanged water, separated by filtration and dried in a vacuum to obtain 15 g of a white resin. By the GPC measurement, the weight average molecular weight (polystyrene standard) was confirmed to be 4,800.

A-73:

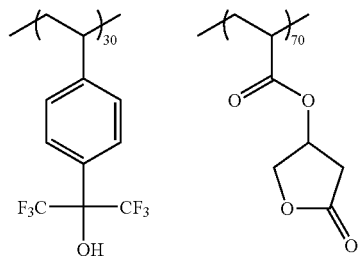

Mw = 4800
Mw/Mn = 2.53

Examples 1 to 9 and Comparative Examples 1 to 7

Preparation of Topcoat Composition

The components shown in Table 2 below were dissolved in a solvent to prepare a solution having a solid content concentration of 4 mass %, and the obtained solution was filtered through a polyethylene filter having a pore size of 0.1 μm to prepare a topcoat composition. The topcoat compositions prepared were evaluated by the following methods, and the results are shown in Table 2. As for each component in the Table, when a plurality of species were used, the ratio is a ratio by mass.

[Evaluation of Receding Contact Angle]

On a substrate obtained by forming a 250 nm-thick photoresist film (GAR-8101G1, produced by Fujifilm Electronics Materials Co., Ltd.) on a silicon wafer, the prepared topcoat composition was coated and baked at 100° C. for 60 seconds to form a topcoat film of about 50 nm in thickness. The measurement of the receding contact angle was performed using a dynamic contact angle meter (manufactured by Kyowa Interface Science Co., Ltd.) by an expansion-contraction method. On the topcoat film, a droplet having an initial droplet size of 36 μL was ejected and suctioned using a syringe at a rate of 6 μL/sec for 8 seconds, and a value when the dynamic contact angle during suction was stabilized was taken as the receding contact angle.

[Followability of Water]

Figure 2:
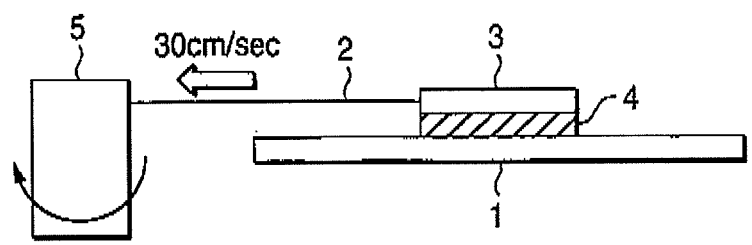
FIG. 2 represents a schematic view related to evaluation of followability of water (side view)

On a substrate obtained by forming a 250 nm-thick photoresist film (GAR-8101G1, produced by Fujifilm Electronics Materials Co., Ltd.) on a silicon wafer, the prepared topcoat composition was coated and baked at 100° C. for 60 seconds to form a topcoat film of about 50 nm in thickness. As shown in FIG. 2, 15 ml of distilled water was dropped by a pipette on the center part of the wafer 1 having formed thereon the topcoat film, and a 10 cm-square quartz plate 3 with a kite string 2 was put on the distilled water paddle to create a state such that the entire space between the wafer 1 and the quartz plate 3 was filled with distilled water 4.

Subsequently, in the state of the wafer 1 being fixed, the kite string 2 attached to the quartz plate 3 was wound on the rotative part of a motor 5 rotating at a speed of 30 cm/sec, and the motor 5 was switched on for 0.5 seconds to move the quartz plate 3. After the quartz plate 3 was moved, the amount of the distilled water remaining under the quartz plate 3 was judged by the following criteria, and this was taken as the indication of followability of water.

FIGS. 3A to 3D are views schematically showing various patterns when the quartz plate 3 is observed from above after moving the quartz plate. The shaded part 6 is the region of distilled water remaining under the quartz plate 3, and the blank region 7 is the region where distilled water fails in following the movement of the quartz plate 3 to allow for leaking in of air.

Figure 3A:
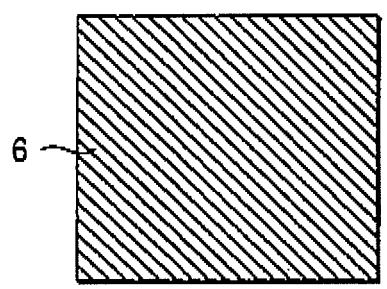
FIGS. 3A to 3D represent schematic views related to evaluation of followability of water (top view).
Figure 3B:
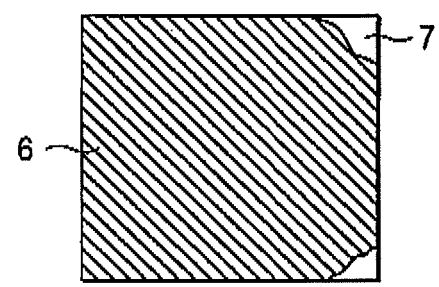
Figure 3C:
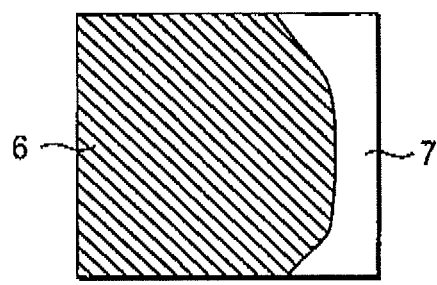
Figure 3D:
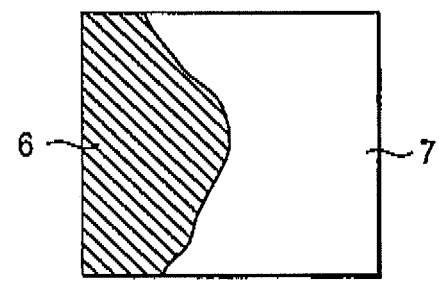

The followability of water is rated A when as shown in FIG. 3A, water remains on the entire substrate surface after the quartz plate is moved, rated B when as shown in FIG. 3B, the area allowing for leaking in of air is about 10% based on the entire substrate area, rated C when as shown in FIG. 3C, the area allowing for leaking in of air is from 20% to less than 50% based on the entire substrate area, and rated D when as shown in FIG. 3D, the area allowing for leaking in of air is 50% or more based on the entire substrate area.

TABLE 2

| | Resin (A) (0.4 g) | Polar Group Content of Resin (A) (number of polar groups/ molecular weight) | Solvent (C) (ratio by mass) | Compound (B) (mg) | Polar Group Content of Compound (B) (number of polar groups/ molecular weight) | Coverage of Compound (B) (%) | Receding Contact Angle (°) | Followability of Water |
|---|---|---|---|---|---|---|---|---|
| Example 1 | A-73 | 8.0E−03 | SL-4/SL-5 (30/70) | BR-23 (4) | 2.2E−03 | 70 | 70 | A |
| Comparative Example 1 | A-73 | 8.0E−03 | SL-4/SL-5 (30/70) | — | — | — | 56 | D |
| Example 2 | A-48 | 5.6E−03 | SL-1/SL-2 (80/20) | HR-23 (8) | 2.2E−03 | 88 | 80 | A |
| Example 3 | A-48 | 5.6E−03 | SL-1/SL-2 (80/20) | HR-43 (8) | 4.5E−03 | 38 | 71 | B |
| Example 4 | A-48 | 5.6E−03 | SL-1/SL-2 (80/20) | HR-23 (3.5) | 2.2E−03 | 44 | 72 | B |
| Example 5 | A-48 | 5.6E−03 | SL-1/SL-2 (80/20) | HR-23 (3) | 2.2E−03 | 27 | 69 | C |
| Comparative Example 2 | A-48 | 5.6E−03 | SL-1/SL-2 (80/20) | HR-44 (10) | 4.7E−03 | <10 | 64 | D |
| Comparative Example 3 | A-48 | 5.6E−03 | SL-1/SL-2 (80/20) | — | — | — | 64 | D |
| Example 6 | A-66 | 5.3E−03 | SL-1/SL-3 (90/10) | HR-14 (6) | 4.0E−03 | 68 | 75 | A |
| Comparative Example 4 | A-66 | 5.3E−03 | SL-1/SL-3 (90/10) | — | — | — | 63 | D |
| Example 7 | A-54 | 6.3E−03 | SL-4/SL-5 (30/70) | HR-2 (9) | 1.7E−03 | 95 | 85 | A |
| Comparative Example 5 | A-54 | 6.3E−03 | SL-4/SL-5 (30/70) | — | — | — | 60 | D |
| Example 8 | A-69 | 5.6E−03 | SL-4/SL-5 (20/80) | HR-8 (5) | 3.9E−03 | 56 | 71 | A |
| Example 9 | A-69 | 5.6E−03 | SL-4/SL-5 (20/80) | HR-45 (5) | 4.4E−03 | 31 | 67 | B |
| Comparative Example 6 | A-69 | 5.6E−03 | SL-4/SL-5 (20/80) | HR-46 (5) | 4.7E−03 | <10 | 62 | D |
| Comparative Example 7 | A-69 | 5.6E−03 | SL-4/SL-5 (20/80) | — | — | — | 62 | D |

The resin (A) shown in Table 2 has the weight average molecular weight (Mw), dispersity (Mw/Mn) and compositional ratio (by mole) shown in Table 3. The composition ratio is a ratio of repeating units from the left.

TABLE 3

| Resin (A) | Mw | Mw/Mn | Compositional Ratio |
|---|---|---|---|
| A-48 | 9800 | 1.86 | 100 |
| A-54 | 12000 | 2.25 | 60/30/10 |
| A-66 | 16000 | 1.98 | 80/20 |
| A-69 | 10000 | 2.02 | 50/50 |

Alkaline-insoluble compounds (B) in Table 2, other than those set forth above, are shown below.

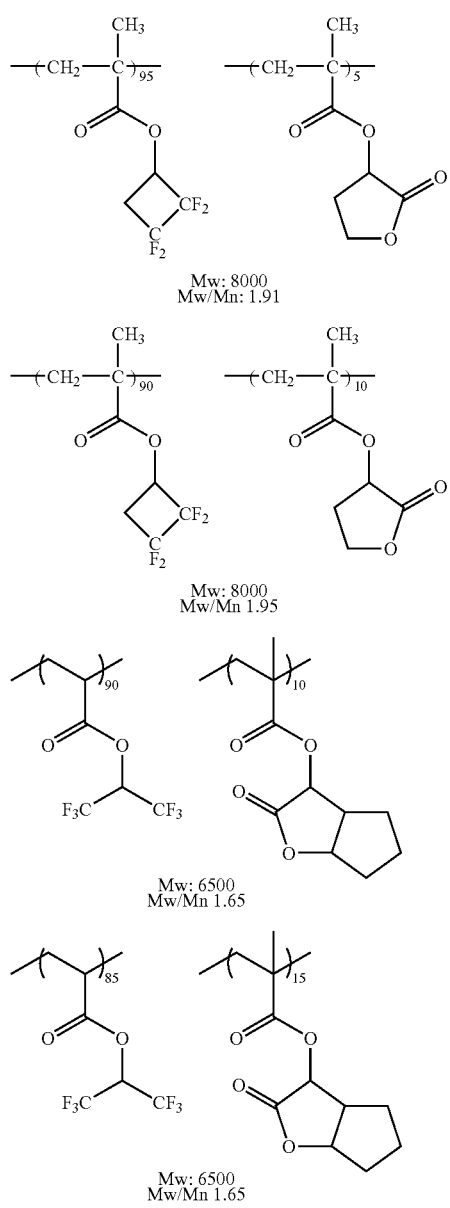

The solvents in Table 2 are as follows.
SL-1: n-Decane
SL-2: 2-Octanol
SL-3: 1-Octanol
SL-4: Diisoamyl ether
SL-5; 4-Methyl-2-pentanol As apparent from Table 2, the topcoat composition of the present invention can form a topcoat film having a large receding contact angle for immersion liquid and being excellent in the followability of immersion liquid.

According to the present invention, a topcoat composition capable of forming a topcoat film that can be separated in the developing step in the fine pattern-forming process by immersion exposure and is assured of a large receding contact angle for the immersion liquid and excellent followability of the immersion liquid, an alkali developer-soluble topcoat film using the composition, and a pattern forming method using the topcoat film, can be provided.

The entire disclosure of each and every foreign patent application from which the benefit of foreign priority has been claimed in the present application is incorporated herein by reference, as if fully set forth.

What is claimed in:

1. A topcoat composition to be applied on a resist film to form a topcoat film, consisting essentially of:
   (A) an alkali-soluble resin;
   (B) a resin containing at least one of an Si atom and an F atom, and increasing the contact angle on a surface of the topcoat film; and
   (C) a solvent,
   wherein the receding contact angle of the topcoat film is 70° or more, and when the topcoat film is formed by adding the resin (B) in an amount of 1 part by mass based on 100 parts by mass of the total solid amount of the topcoat film but not including the solid amount of the resin (B), the resin (B) increases the receding contact angle of the topcoat film by 5.0% or more when compared with the receding contact angle of the topcoat film formed by the same topcoat composition except for not containing the resin (B).

2. The topcoat composition as claimed in claim 1, wherein the content of a polar group(s) in the resin (B) (number of a polar group(s)/molecular weight) is 80% or less of that in the resin (A).

3. The topcoat composition as claimed in claim 1, wherein the resin (B) is insoluble in an alkali developer.

4. The topcoat composition as claimed in claim 1, wherein the resin (A) has a polar group represented by formula (I):

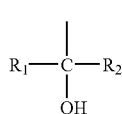

(1)

wherein $R_1$ and $R_2$ are the same or different and each independently represents a hydrogen atom or an alkyl group, and $R_1$ and $R_2$ may combine with each other to form a ring.

5. The topcoat composition as claimed in claim 1, wherein the solvent (C) contains an alcohol solvent.

6. The topcoat composition as claimed in claim 1, wherein the resin (A) has a polar group represented by formula (2):

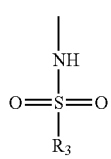

(2)

wherein $R_3$ represents an alkyl group or a cycloalkyl group.

7. The topcoat composition as claimed in claim 1, wherein the addition amount of the resin (B) is 10 mass % or less based on the entire amount of solid contents of the topcoat composition.

8. The topcoat composition as claimed in claim 1, wherein the resin (B) is a solid at an ordinary temperature.

9. The topcoat composition as claimed in claim 1, wherein the topcoat film is soluble in an alkali developer.

10. A pattern forming method, comprising:
    applying the topcoat composition claimed in claim 1 on a resist film to form a topcoat film; and
    exposing and developing the resist film.

11. The pattern forming method as claimed in claim 10, wherein the resist film is exposed in water as an immersion liquid.

12. The pattern forming method as claimed in claim 10, wherein the step of exposing employs an ArF light.

13. A topcoat composition to be applied on a resist film to form a topcoat film, consisting essentially of:
(A) an alkali-soluble resin;
(B) a resin containing at least one of an Si atom and an F atom, and increasing the contact angle on a surface of the topcoat film; and
(C) a solvent;
wherein the receding contact angle of the topcoat film is 70° or more, and the addition amount of the resin (B) is 10 mass % or less based on the entire amount of solid contents of the topcoat composition.

14. The topcoat composition as claimed in claim 13, wherein the resin (B) is insoluble in an alkali developer.

15. A pattern forming method, comprising:
applying the topcoat composition claimed in claim 13 on a resist film to form a topcoat film; and
exposing and developing the resist film.

16. The pattern forming method as claimed in claim 15, wherein the resist film is exposed in water as an immersion liquid.

17. The pattern forming method as claimed in claim 15, wherein the step of exposing employs an ArF light.

18. A topcoat composition to be applied on a resist film to form a topcoat film, consisting essentially of:
(A) an alkali-soluble resin;
(B) a resin containing at least one of an Si atom and an F atom, and increasing the contact angle on a surface of the topcoat film; and
(C) a solvent;
wherein the topcoat film is soluble in an alkali developer and the receding contact angle of the topcoat film is 70° or more.

19. The topcoat composition as claimed in claim 18, wherein the resin (B) is insoluble in an alkali developer.

20. The topcoat composition as claimed in claim 18, wherein the addition amount of the resin (B) is 10 mass % or less based on the entire amount of solid contents of the topcoat composition.

21. A pattern forming method, comprising:
applying the topcoat composition claimed in claim 18 on a resist film to form a topcoat film; and
exposing and developing the resist film.

22. The pattern forming method as claimed in claim 21, wherein the resist film is exposed in water as an immersion liquid.

23. The pattern forming method as claimed in claim 21, wherein the step of exposing employs an ArF light.

24. A pattern forming method, comprising:
applying a topcoat composition on a resist film to form a topcoat film; and
exposing and developing the resist film,
wherein the topcoat composition consists essentially of:
(A) an alkali-soluble resin;
(B) a resin containing at least one of an Si atom and an F atom, and increasing the contact angle on a surface of the topcoat film; and
(C) a solvent,
wherein the receding contact angle of the topcoat film is 70° or more.

25. The pattern forming method as claimed in claim 24, wherein the resist film is exposed in water as an immersion liquid.

26. The pattern forming method as claimed in claim 24, wherein the step of exposing employs an ArF light.

27. The topcoat composition as claimed in claim 1, wherein the amount of the resin (B) is from 0.1 to 10% by mass based on the entire solids content of the topcoat composition.

28. The topcoat composition as claimed in claim 13, wherein
the amount of the resin (B) is from 0.1 to 10% by mass based on the entire solids content of the topcoat composition.

29. The topcoat composition as claimed in claim 18, wherein the amount of the resin (B) is from 0.1 to 10% by mass based on the entire solids content of the topcoat composition.

30. The pattern forming method as claimed in claim 24, wherein the amount of the resin (B) is from 0.1 to 10% by mass based on the entire solids content of the topcoat composition.

* * * * *